(12) United States Patent
Daio

(10) Patent No.: US 8,976,827 B2
(45) Date of Patent: Mar. 10, 2015

(54) DRIVING DEVICE AND LIGHT-EMITTING UNIT

(71) Applicant: Sony Corporation, Tokyo (JP)

(72) Inventor: Katsuhisa Daio, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/030,274

(22) Filed: Sep. 18, 2013

(65) Prior Publication Data

US 2014/0098832 A1    Apr. 10, 2014

(30) Foreign Application Priority Data

Oct. 4, 2012  (JP) .................. 2012-222163

(51) Int. Cl.
*H01S 3/00* (2006.01)
*H01S 5/06* (2006.01)
*H01S 5/026* (2006.01)
*H01S 5/042* (2006.01)
*H01S 5/183* (2006.01)
*H01S 5/42* (2006.01)
*H01S 5/0683* (2006.01)

(52) U.S. Cl.
CPC ............... *H01S 5/06* (2013.01); *H01S 5/0261* (2013.01); *H01S 5/042* (2013.01); *H01S 5/18394* (2013.01); *H01S 5/423* (2013.01); *H01S 5/0425* (2013.01); *H01S 5/06837* (2013.01); *H01S 5/18311* (2013.01)
USPC ...................................... 372/38.02

(58) Field of Classification Search
CPC ................... H01S 5/042; H01S 5/06
USPC ........... 372/38.01, 38.02, 38.04, 38.07, 38.09
See application file for complete search history.

(56) References Cited

U.S. PATENT DOCUMENTS

| | | | |
|---|---|---|---|
| 6,577,180 B2 * | 6/2003 | Liu ............................... 327/532 |
| 7,916,162 B2 * | 3/2011 | Inukai .......................... 347/237 |
| 7,991,032 B2 * | 8/2011 | Daio et al. ................. 372/38.02 |
| 8,140,045 B2 * | 3/2012 | Kurokawa et al. ............ 455/333 |
| 2010/0176776 A1 * | 7/2010 | Wachi ........................... 323/282 |

FOREIGN PATENT DOCUMENTS

| | | |
|---|---|---|
| JP | 57-013790 | 1/1982 |
| JP | 2010-251429 | 11/2010 |

* cited by examiner

*Primary Examiner* — Xinning Niu
*Assistant Examiner* — Vu A Vu
(74) *Attorney, Agent, or Firm* — Sony Corporation

(57) ABSTRACT

A driving device includes: a driving circuit configured to provide a drive current; a first detecting circuit; a second detecting circuit configured to detect a first reference current or a physical quantity corresponding thereto, as well as a second reference current or a physical quantity corresponding thereto; a first generating circuit configured to generate an additive voltage as a control voltage at a light-emission time of a light-emitting element, and further to generate a second voltage as a control voltage at a non-light-emission time of the light-emitting element; and a second generating circuit configured to generate a third reference current. The second detecting circuit has a first adder circuit that generates the first reference current by adding the second reference current and the third reference current with each other.

11 Claims, 12 Drawing Sheets

DRIVING DEVICE AND LIGHT-EMITTING UNIT

CROSS REFERENCE TO RELATED APPLICATIONS

This application claims the benefit of priority under 35 U.S.C. §119 from Japanese Priority Patent Application JP 2012-222163 filed on Oct. 4, 2012, the entire contents of each which is incorporated herein by reference.

BACKGROUND

The present technology relates to a driving device that drives a light-emitting element, and a light-emitting unit that includes such a driving device, and more specifically to a driving device that is well-suited for driving a surface-emitting type semiconductor laser, and a light-emitting unit that includes such a driving device.

In the field of a laser printer, to meet the demand for higher-speed performance and higher-density mounting, it has been taken into consideration to achieve higher-speed performance and higher-density mounting of a surface-emitting type semiconductor laser (hereinafter simply called a "surface-emitting laser"). However, the surface-emitting laser may have a light-emission resistance of nearly about 100 ohms that is larger by an order of magnitude as compared with an edge-emitting type semiconductor laser (hereinafter simply called an "edge-emitting laser"), as well as a larger parasitic capacitance that may be increased due to a multichannel configuration. In addition, the light-emission resistance of the surface-emitting laser may vary due to any change in temperature that could be caused by light emission, resulting in variation in the light-emission characteristics.

Consequently, in the surface-emitting laser, stabilization of the light-emission characteristics has been often attempted using a current driving method instead of a voltage driving method that could be influenced by variation in the light-emission resistance (for example, see Japanese Unexamined Patent Application Publication No. S57-13790). In the surface-emitting laser, however, the rising characteristics (TR characteristics) and the falling characteristics (TF characteristics) that are not significantly influenced in the edge-emitting laser may depend on a time constant that is determined by the light-emission resistance and parasitic capacitance. In the current driving method, therefore, a waveform of a driving signal for driving the surface-emitting laser would lose steep rising/falling edges.

SUMMARY

Although various driving methods have been typically proposed to deal with such a disadvantage, each of those methods has been disadvantageous in that a control thereof may be lacking in the effectiveness due to the excessive complexity. Consequently, the applicant of the present disclosure has proposed a driving device capable of making the TR characteristics and the TF characteristics of a drive current steep in a voltage driving method, as well as maintaining the drive current at a constant value irrespective of any variation in the light-emission resistance (Japanese Unexamined Patent Application Publication No. 2010-251429).

Meanwhile, in the surface-emitting laser, in the event of variation in device temperature, a change may arise in a difference between an effective resonator length of a resonator structure and a light-emission wavelength of an active layer (wavelength detuning $\Delta\lambda$), resulting in variation in a threshold current depending on a magnitude of the wavelength detuning $\Delta\lambda$. In some cases, in the surface-emitting laser, the wavelength detuning $\Delta\lambda$ may be increased to decrease the threshold current. In such a case, however, there has been a disadvantage that a waveform of an optical output would provide less steep rising/falling edges as compared with a current pulse waveform if the surface-emitting laser is driven by applying pulse signals.

Further, in the surface-emitting laser, a phenomenon called "droop" may occur in which an optical output also decreases gradually with an increase of device temperature. The phenomenon more prominently arises as an injection power is increased. Further, the droop more prominently arises as a pulse pattern in pulse driving becomes denser.

Accordingly, for solving these advantages, it is necessary to add a correction current to a drive current. However, in the driving device described in Japanese Unexamined Patent Application Publication No. 2010-251429, if a correction current is added to a drive current, a feedback loop attempts to decrease the correction current, which has caused a disadvantage that it is difficult to perform an accurate correction on the drive current.

It is desirable to provide a driving device capable of performing an accurate correction on a drive current in a voltage driving method, and a light-emitting unit that includes such a driving device.

According to an embodiment of the present technology, there is provided a first driving device including: a driving circuit configured to provide a drive current depending on a magnitude of a control voltage to a light-emitting element; a first detecting circuit configured to detect the drive current or a physical quantity corresponding thereto; a second detecting circuit configured to detect a first reference current to be used as a reference for a drive current at a light-emission time of the light-emitting element or a physical quantity corresponding thereto, as well as a second reference current to be used as a reference for a drive current at a non-light-emission time of the light-emitting element or a physical quantity corresponding thereto; a first generating circuit configured to generate an additive voltage obtained by adding a first voltage and a correction voltage with each other as a control voltage at the light-emission time of the light-emitting element, and further to generate a second voltage that is derived according to a result of comparing a detection result from the first detecting section at the non-light-emission time of the light-emitting element and a detection result from the second detecting section at the non-light-emission time of the light-emitting element as a control voltage at the non-light-emission time of the light-emitting element, the first voltage being derived according to a result of comparing a detection result from the first detecting section at the light-emission time of the light-emitting element and a detection result from the second detecting section at the light-emission time of the light-emitting element, the correction voltage being derived by a predetermined calculation; and a second generating circuit configured to generate a third reference current that is equivalent to a difference between the first reference current and the second reference current by using the control voltage at the light-emission time of the light-emitting element, the first voltage, the second voltage, and the second reference current. The second detecting circuit has a first adder circuit that generates the first reference current by adding the second reference current and the third reference current with each other.

According to an embodiment of the present technology, there is provided a first light-emitting unit including: a light-emitting element; a driving circuit configured to provide a drive current depending on a magnitude of a control voltage to the light-emitting element; a first detecting circuit configured to detect the drive current or a physical quantity corresponding thereto; a second detecting circuit configured to detect a first reference current to be used as a reference for a drive current at a light-emission time of the light-emitting element or a physical quantity corresponding thereto, as well as a second reference current to be used as a reference for a drive current at a non-light-emission time of the light-emitting element or a physical quantity corresponding thereto; a first generating circuit configured to generate an additive voltage obtained by adding a first voltage and a correction voltage with each other as a control voltage at the light-emission time of the light-emitting element, and further to generate a second voltage that is derived according to a result of comparing a detection result from the first detecting section at the non-light-emission time of the light-emitting element and a detection result from the second detecting section at the non-light-emission time of the light-emitting element as a control voltage at the non-light-emission time of the light-emitting element, the first voltage being derived according to a result of comparing a detection result from the first detecting section at the light-emission time of the light-emitting element and a detection result from the second detecting section at the light-emission time of the light-emitting element, the correction voltage being derived by a predetermined calculation; and a second generating circuit configured to generate a third reference current that is equivalent to a difference between the first reference current and the second reference current by using the control voltage at the light-emission time of the light-emitting element, the first voltage, the second voltage, and the second reference current. The second detecting circuit has a first adder circuit that generates the first reference current by adding the second reference current and the third reference current with each other.

In the first driving device and the first light-emitting unit according to the above-described respective embodiments of the present technology, a drive current flowing through the light-emitting element at the light-emission time is specified by a control voltage that is generated by adding the first voltage and the correction voltage with each other. Further, the first voltage is generated according to a result of comparing the reference current that is generated using the control voltage and the drive current flowing through the light-emitting element at the light-emission time with each other. Consequently, a feedback loop acts on the first voltage, while does not act on the correction voltage. As a result, it is possible to correct a waveform of the control voltage using the correction voltage in such a manner that a pulse waveform of an optical output from the light-emitting element becomes similar to a rectangular waveform.

According to an embodiment of the present technology, there is provided a second driving device including: a driving circuit configured to provide a drive current depending on a magnitude of a control voltage to a light-emitting element; a first detecting circuit configured to detect the drive current or a physical quantity corresponding thereto; a second detecting circuit configured to detect a reference current to be used as a reference for the drive current or a physical quantity corresponding thereto; a first generating circuit configured to generate a voltage obtained by adding a first voltage and a correction voltage with each other as the control voltage, the first voltage being derived according to a result of comparing a detection result from the first detecting section and a detection result from the second detecting section, the correction voltage being derived by a predetermined calculation; and a second generating circuit configured to generate the reference current by using the control voltage and the first voltage.

According to an embodiment of the present technology, there is provided a second light-emitting unit including: a light-emitting element; a driving circuit configured to provide a drive current depending on a magnitude of a control voltage to the light-emitting element; a first detecting circuit configured to detect the drive current or a physical quantity corresponding thereto; a second detecting circuit configured to detect a reference current to be used as a reference for the drive current or a physical quantity corresponding thereto; a first generating circuit configured to generate a voltage obtained by adding a first voltage and a correction voltage with each other as the control voltage, the first voltage being derived according to a result of comparing a detection result from the first detecting section and a detection result from the second detecting section, the correction voltage being derived by a predetermined calculation; and a second generating circuit configured to generate the reference current by using the control voltage and the first voltage.

In the second driving device and the second light-emitting unit according to the above-described respective embodiments of the present technology, a drive current flowing through the light-emitting element is specified by a control voltage that is generated by adding the first voltage and the correction voltage with each other. Further, the first voltage is generated according to a result of comparing the reference current that is generated using the control voltage and the drive current flowing through the light-emitting element with each other. Consequently, a feedback loop acts on the first voltage, while does not act on the correction voltage. As a result, it is possible to correct a waveform of the control voltage using the correction voltage in such a manner that a pulse waveform of an optical output from the light-emitting element becomes similar to a rectangular waveform.

In the first and second driving devices as well as the first and second light-emitting units according to the above-described respective embodiments of the present technology, a feedback loop acts on the first voltage, while does not act on the correction voltage, and thus it is possible to correct a waveform of the control voltage using the correction voltage in such a manner that a pulse waveform of an optical output from the light-emitting element becomes similar to a rectangular waveform. As a result, this allows to perform an accurate correction on a drive current in the voltage driving method.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

Figure 13:
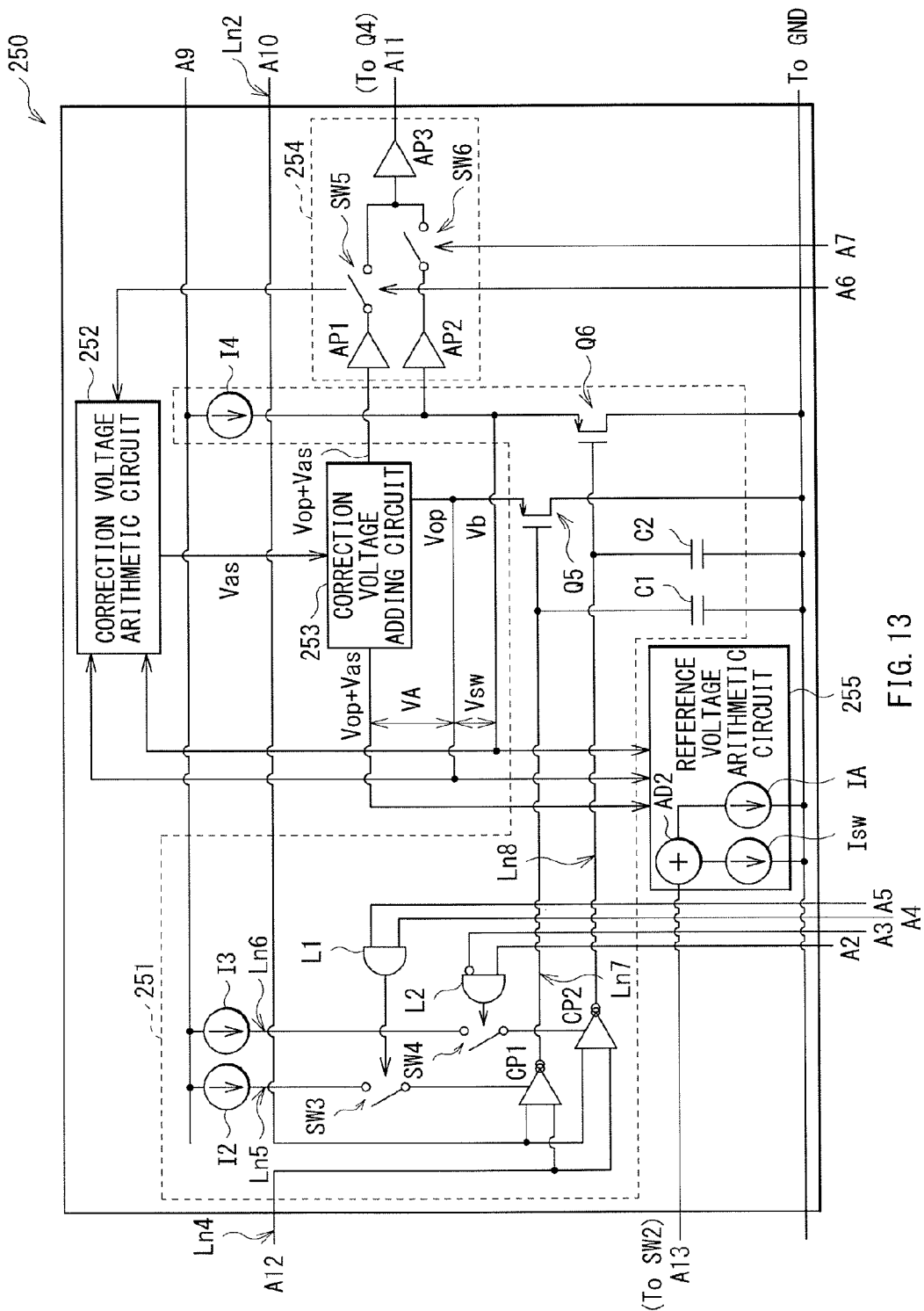
FIG. 13 is a schematic block diagram showing an example of a simplified configuration of a control voltage generating circuit illustrated in FIG. 8.
Figure 14:
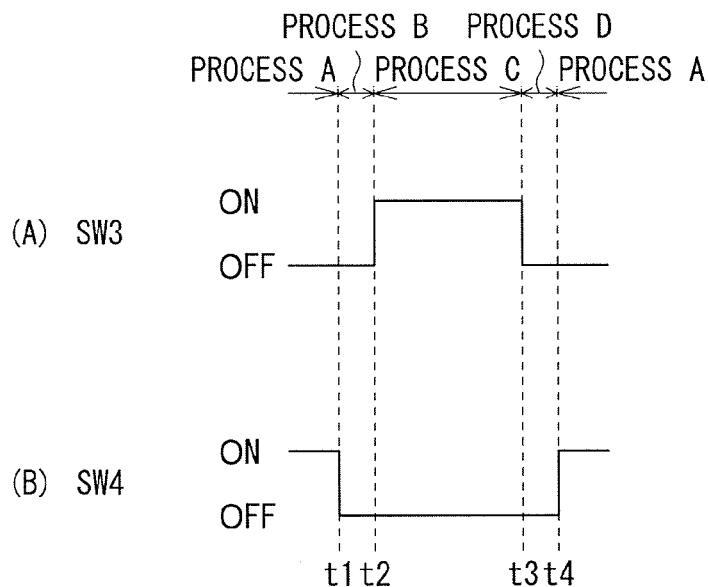

(A) and (B) of FIG. 14 are each a timing chart showing an example of a waveform of a pulse signal to be applied to switches SW3 and SW4 illustrated in FIG. 13.

Figure 8:
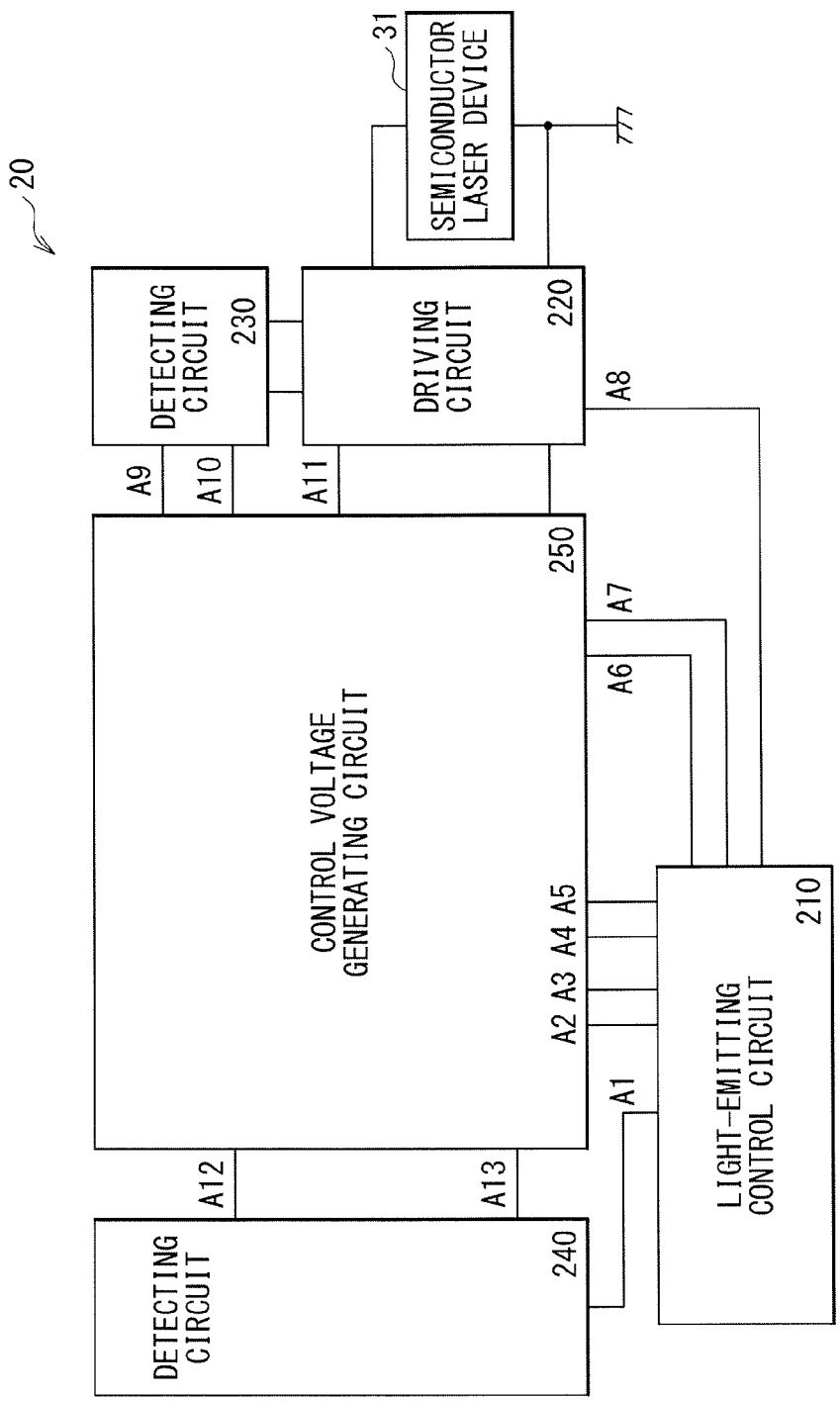
FIG. 8 is a schematic block diagram showing an example of a simplified configuration of a laser driving circuit illustrated in FIG. 1.
Figure 15:
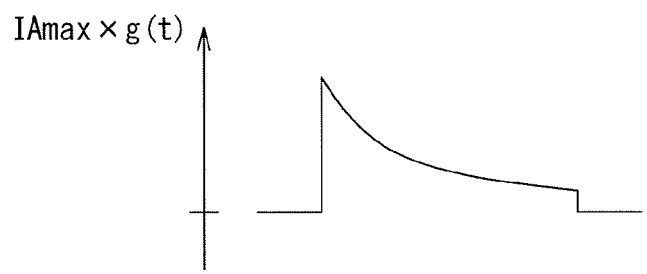

FIG. 15 is a schematic diagram showing an example of a correction current for rising compensation in the control voltage generating circuit illustrated in FIG. 8.

Figure 16:
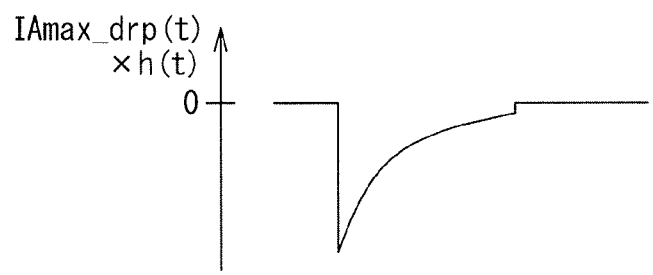

FIG. 16 is a schematic diagram showing an example of a correction current for droop compensation in the control voltage generating circuit illustrated in FIG. 8.

Figure 17:
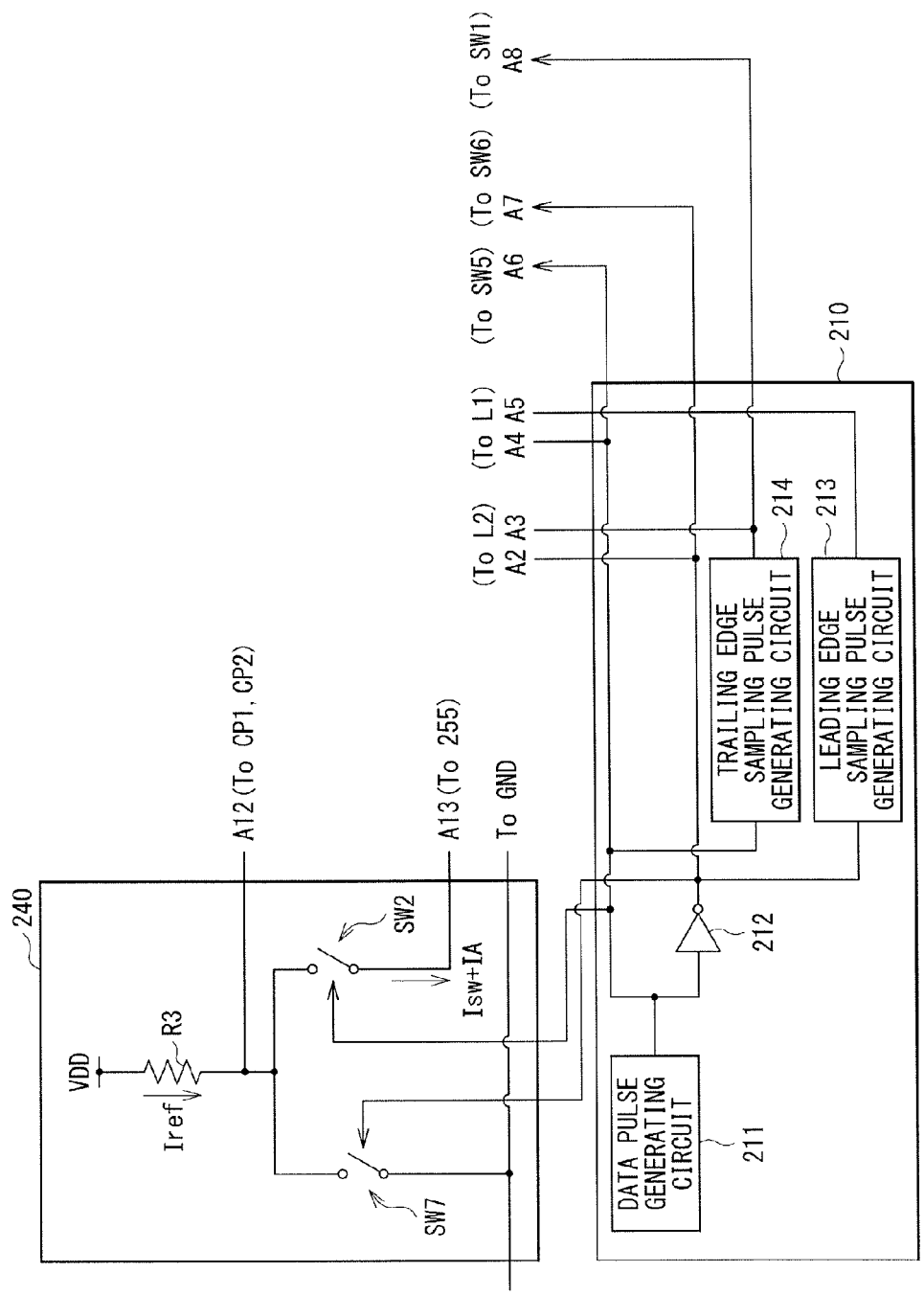

FIG. 17 is a schematic block diagram showing an modification example of a simplified configuration of the laser driving circuit illustrated in FIG. 8.

DETAILED DESCRIPTION

Hereinafter, some embodiments of the present technology are described in details with reference to the drawings. It is to be noted that the description is provided in the order given below.
1. Embodiment (a current source for generating a bias reference current Ioff_ref is provided)
2. Modification Example (a current source for generating a bias reference current Ioff_ref is not provided)

1. Embodiment

[Configuration]

Figure 1:
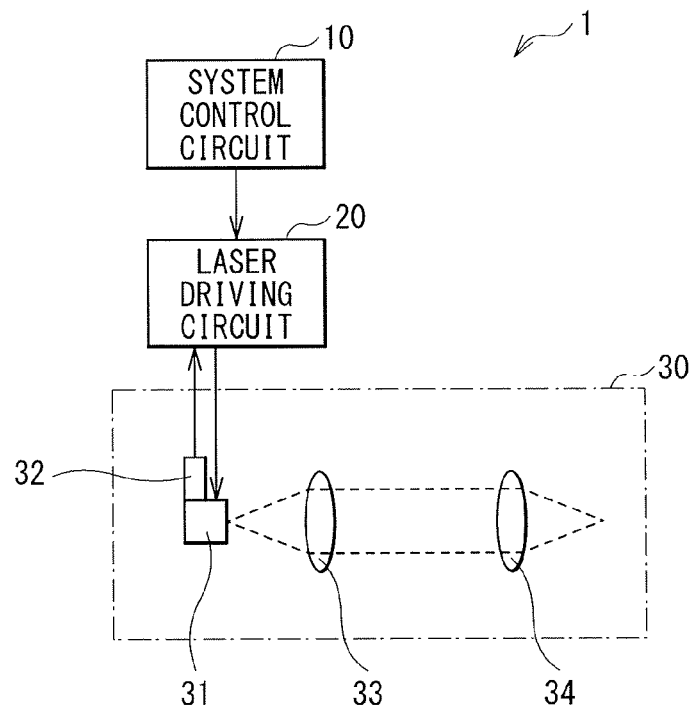
FIG. 1 is a schematic block diagram showing an example of a simplified configuration of a light-emitting unit according to one embodiment of the present technology.

FIG. 1 shows an example of a simplified configuration of a light-emitting unit 1 according to one embodiment of the present technology. As shown in FIG. 1, for example, the light-emitting unit 1 may be provided with a system control circuit 10, a laser driving circuit 20, and an optical system 30. The system control circuit 10 controls a drive of a laser structure section 31B via the laser driving circuit 20. The optical system 30 may have, for example, the laser structure section 31B, a temperature detecting section 32, a collimating lens 33, and an object lens 34. The laser driving circuit 20 corresponds to a specific but not limitative example of a "driving device" of the present technology. The laser structure section 31B corresponds to a specific but not limitative example of a "light-emitting element" of the present technology.

Figure 2:
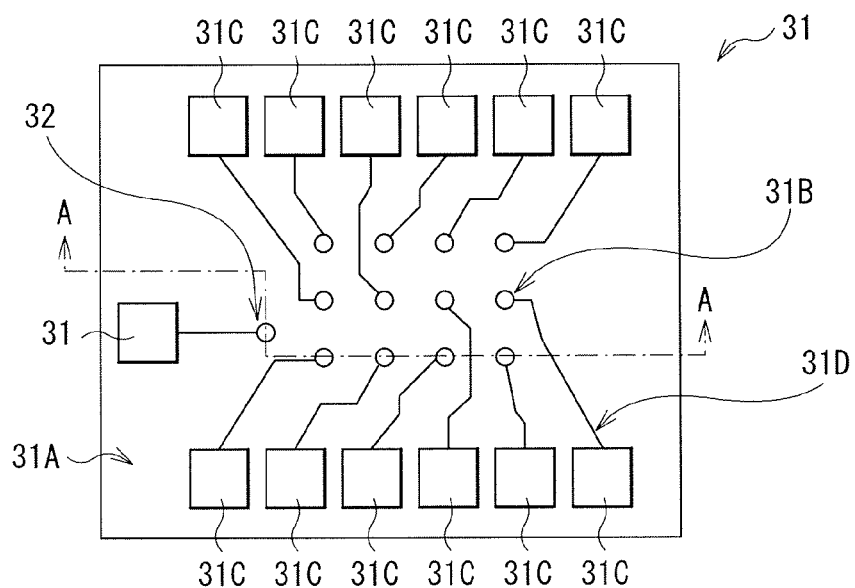
FIG. 2 is a diagram showing an example of a top face configuration of a semiconductor laser device illustrated in FIG. 1.
Figure 3:
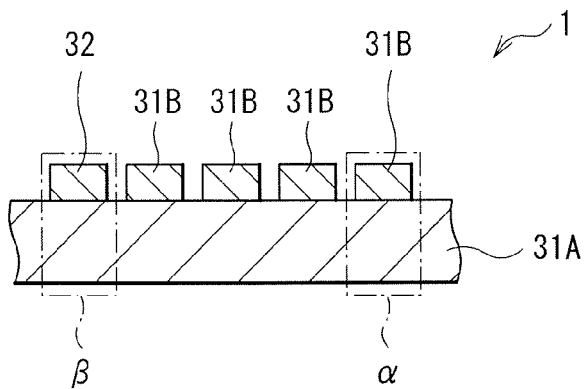
FIG. 3 is a diagram showing an example of a cross-sectional structure in an A-A arrow direction of the semiconductor laser device illustrated in FIG. 2.

FIG. 2 shows an example of a top face configuration of the laser structure section 31B. FIG. 3 shows an example of a cross-sectional structure in an A-A arrow direction of the laser structure section 31B illustrated in FIG. 2. The laser structure section 31B may include, for example, a plurality of laser structure sections 31B on the top surface of a substrate 31A. On the top surface of the substrate 31A, there is provided the single temperature detecting section 32. Although FIG. 2 illustrates, by an example, a case where the twelve laser structure sections 31B are arranged two-dimensionally on the top surface of the substrate 31A, the number of the laser structure sections 31B is not specifically limited. Further, FIG. 2 illustrates by an example a case where the single temperature detecting section 32 is provided on the top surface of the substrate 31A, although the plurality of temperature detecting section 32 may be provided on the top surface of the substrate 31A.

Each of the laser structure sections 31B, which is a surface-emitting type semiconductor laser that emits light in a direction of a normal line of the substrate 31A, has a vertical resonator structure in which an active layer is interposed between a pair of multilayer-film reflecting mirrors. The active layer may be configured to include, for example, a reddish material (for example, GaInP or AlGaInP). On this occasion, a wavelength detuning $\Delta\lambda$ that is a difference between a light-emission wavelength of the active layer and an oscillation wavelength of the laser structure sections 31B is about 15 nm or more. It is to be noted that the active layer may be configured of any other material, and may be configured to include, for example, an infrared material (for example, GaAs or AlGaAs) alternatively. On this occasion, the wavelength detuning $\Delta\lambda$ is about 13 nm or more.

The temperature detecting section 32 detects the temperature of a semiconductor laser device. The temperature detecting section 32, which is a semiconductor temperature detecting section, may be configured of, for example, a surface-emitting type semiconductor laser that emits no light externally. Each of the laser structure sections 31B and the temperature detecting section 32 are electrically connected with pad electrodes 31C via extraction electrodes 32D. The collimating lens 33 is an optical element that shapes a laser beam emitted from the laser structure section 31B into a parallel beam. The object lens 34 is an optical element that focuses a laser beam that is paralleled by the collimating lens 33, while irradiating such a laser beam toward an object to be irradiated (not shown in the drawing).

Figure 4:
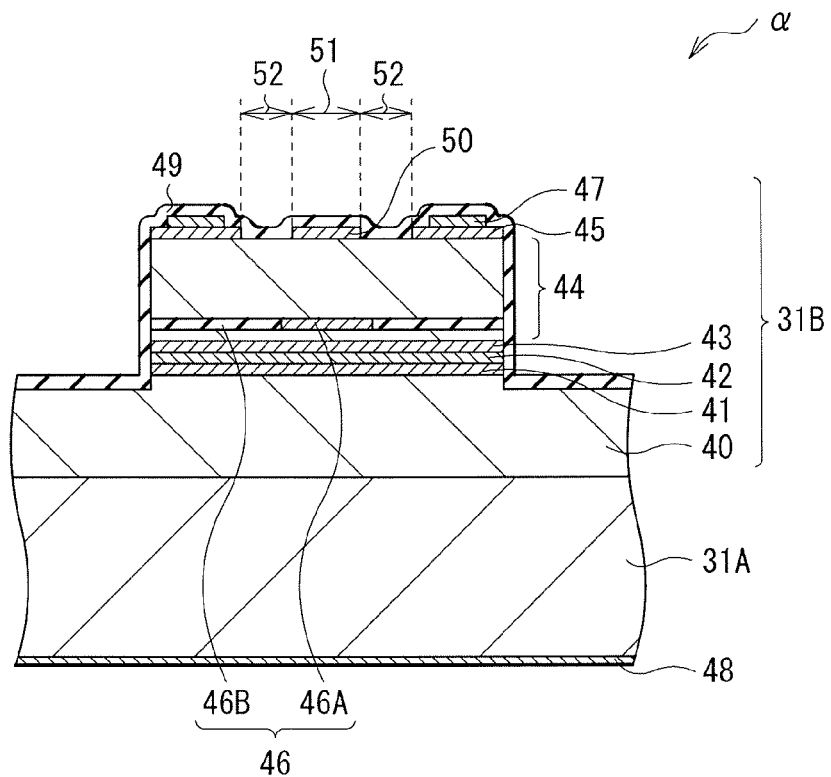
FIG. 4 is a diagram showing an example of a cross-sectional structure of the semiconductor laser device illustrated in FIG. 1.
Figure 5:
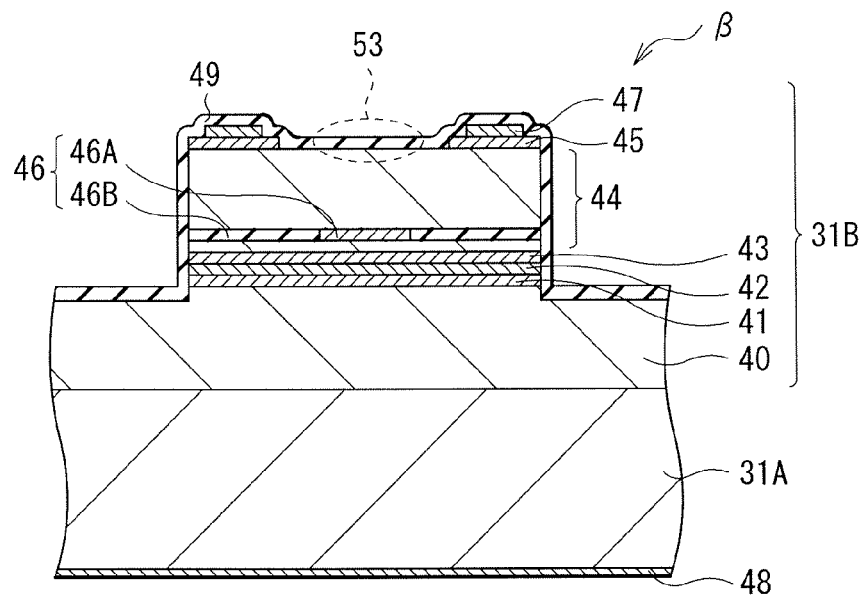
FIG. 5 is a diagram showing an example of a cross-sectional structure of a temperature detecting section illustrated in FIG. 1.

FIG. 4 magnifies and illustrates an example of a cross-sectional structure of a portion $\alpha$ including one laser structure section 31B (see FIG. 3) among the laser structure sections 31B. FIG. 5 magnifies and illustrates an example of a cross-sectional structure of a portion $\beta$ including one temperature detecting section 32 (see FIG. 3) among the laser structure sections 31B. In this embodiment of the present technology, both of the laser structure section 31B and the temperature detecting section 32, which are formed on the substrate 31A as a growing substrate, may have the same lamination structure, for example, as shown in FIG. 4 and FIG. 5.

For example, both of the laser structure section 31B and the temperature detecting section 32 may be each configured in such a manner that a lower DBR layer 40, a lower spacer layer 41, an active layer 42, an upper spacer layer 43, an upper DBR layer 44, and a contact layer 45 are laminated in this order from the substrate 31A side. In other words, in the laser structure section 31B and the temperature detecting section 32, the same lamination structure is employed for a laminated portion (PIN junction portion) from the lower DBR layer 40 up to the contact layer 45.

Further, each of the laser structure section 31B and the temperature detecting section 32 may include, for example, a current narrowing layer 46 as a part of the upper DBR layer 44. Further, each of the laser structure section 31B and the temperature detecting section 32 has a mesa form, and in concrete terms, a laminated portion from the top of the lower DBR layer 40 up to the contact layer 45 takes the mesa form. As shown in FIG. 4 and FIG. 5, for example, the contact layer 45 may be formed only at an outer edge portion on the top surface of the upper DBR layer 44. It is to be noted that the contact layer 45 may be alternatively formed over a whole area of the top surface of the upper DBR layer 44.

The substrate 31A may be, for example, an n-type GaAs substrate. The lower DBR layer 40 is a multilayer-film reflecting mirror (not shown in the drawing) that is configured by laminating a high-refractive-index layer and a low-refractive-index layer alternately. Hereupon, the low-refractive-index layer may be configured of, for example, an n-type $Al_{x1}Ga_{1-x1}As$ with an optical thickness of $\lambda/4$ ($\lambda$ is an oscillation wavelength), while the high-refractive-index layer may be configured of, for example, an n-type $Al_{x2}Ga_{1-x2}As$ (x1>x2) with the optical thickness of $\lambda/4$. It is to be noted that examples of n-type impurities may include silicon (Si), and selenium (Se). The lower spacer layer 41 may be configured of, for example, an undoped AlGaAs material. The active layer 42 may be configured of, for example, an undoped GaAs-based material. In the active layer 42, a region in opposition to a current injection region 46A to be hereinafter described acts as a light-emitting region. The upper spacer layer 43 may be configured of, for example, an undoped AlGaAs material.

The upper DBR layer 44 is a multilayer-film reflecting mirror (not shown in the drawing) that is configured by laminating a high-refractive-index layer and a low-refractive-index layer alternately. Hereupon, the low-refractive-index layer may be configured of, for example, a p-type $Al_{x3}Ga_{1-x3}As$ with the optical thickness of $\lambda/4$, while the high-refractive-index layer may be configured of, for example, a p-type $Al_{x4}Ga_{1-x4}As$ (x3>x4) with the optical thickness of $\lambda/4$. The contact layer 45 may be configured of, for example, a p-type GaAs material. It is to be noted that examples of p-type impurities may include zinc (Zn), magnesium (Mg), and beryllium (Be). The current narrowing layer 46 has a current narrowing region 46B at an outer edge region thereof, and has the current injection region 46A at a central region thereof. The current injection region 46A may be configured of, for example, a p-type AlGaAs material or a p-type AlAs material. The current narrowing region 46B, which is configured to include $Al_2O_3$ (aluminum oxide), is derived by oxidation of aluminum in concentrated amount that is contained in AlGaAs or AlAs from the side face in a manufacturing process. Therefore, the current narrowing layer 46 has a functionality to narrow a current.

Further, in the laser structure section 31B and the temperature detecting section 32, a ring-like upper electrode 47 having an opening at a region corresponding to the above-described current injection region 46A is formed on the top surface of the contact layer 45. The upper electrode 47 is connected to a lead wire 31D. Additionally, a lower electrode 48 is formed at the backside of the substrate 31A. The lower electrode 48 functions as a common electrode for each of the laser structure sections 31B and the temperature detecting section 32. What is more, an insulating layer 49 is formed on a front surface (side surface and top surface) of each of the laser structure section 31B and the temperature detecting section 32. The insulating layer 49 is formed so as to cover the side surface and top surface of mesa-shaped portions on the laser structure section 31B and the temperature detecting section 32.

Hereupon, the upper electrode 47 and the pad electrode 31C, which may be configured in a manner of laminating, for example, titanium (Ti), platinum (Pt), and gold (Au) in this order, are electrically connected with the contact layer 45. The lead wire 31D may be configured of, for example, a solder. The lower electrode 48 may have a structure of laminating, for example, an alloy of gold (Au) and germanium (Ge), nickel (Ni), and gold (Au) in this order from the substrate 31A side, and is electrically connected with the substrate 31A.

Further, a phase adjustment layer 50 is formed on the top surface of the laser structure section 31B, in concrete terms, between the top surface of a semiconductor portion of the laser structure section 31B and the insulating layer 49. The phase adjustment layer 50 is formed at a central part of a region where a laser beam is emitted out (that is, a region where a fundamental transverse mode oscillation takes place principally). Here, a laminated portion composed of a portion that is opposed to the phase adjustment layer 50 on the insulating layer 49 and the phase adjustment layer 50 is served as a high-reflectivity region 51, while a portion that is not opposed to the phase adjustment layer 50 on the insulating layer 49 and is an outer edge part of a region where a laser beam is emitted out (that is, a region where a high-order transverse mode oscillation takes place principally) is served as a low-reflectivity region 52.

The phase adjustment layer 50 is made of a material with a film thickness of about $(2a-1)\lambda/4n_1$ (a is an integer of 1 or more, and $n_1$ is a refractive index) and the refractive index $n_1$ lower than the refractive index of the top surface of a semiconductor portion of the laser structure section 31B. The portion that is opposed to the phase adjustment layer 50 on the insulating layer 49 is made of a material with a film thickness of about $(2b-1)\lambda/4n_2$ (b is an integer of 1 or more, and $n_2$ is a refractive index) and the refractive index $n_2$ higher than the refractive index $n_1$ of the phase adjustment layer 50. The portion that is not opposed to the phase adjustment layer 50 on the insulating layer 49 and is an outer edge part of a region where a laser beam is emitted out is made of a material with a film thickness of about $(2c-1)\lambda/4n_3$ (c is an integer of 1 or more, and $n_3$ is a refractive index) and the refractive index $n_3$ lower than the refractive index $n_1$ of the phase adjustment layer 50.

Hereupon, given that the reflectivity of the high-reflectivity region 51 is $R_1$, the reflectivity of the low-reflectivity region 52 is $R_2$, and the reflectivity in the case where the insulating layer 49 and the phase adjustment layer 50 are not provided at a region where a laser beam is emitted out is $R_3$, each of the refractive indexes may be preferably adjusted to satisfy a relationship represented by the expression given below. This ensures that only the high-order transverse mode oscillation is suppressed without reducing an optical output in the fundamental transverse mode.

$$R_1 \geq R_3 > R_2$$

It is to be noted that the phase adjustment layer 50 may be omitted as appropriate. In such a case, however, the insulating layer 49 may preferably have a thickness enough to ensure that the reflectivity is not reduced at a region where a laser beam is emitted out.

On the other hand, in the temperature detecting section 32, a portion where a laser beam is emitted out on the insulating layer 49 functions as a low-reflectivity layer 53. The low-reflectivity layer 53 is set at a thickness and refractive index to achieve the reflectivity to the degree ensuring that laser oscillation arises only in the laser structure section 31B and no laser oscillation arises in the temperature detecting section 32 when the same current is applied to the laser structure section 31B and the temperature detecting section 32. More specifically, the low-reflectivity layer 53 may be made of a material with a film thickness of about $(2d-1)\lambda/4n_4$ (d is an integer of 1 or more, and $n_4$ is a refractive index) and the refractive index $n_4$ higher than the refractive index of the top surface of a semiconductor portion of the temperature detecting section 32, that is, a dielectric material such as SiN (silicon nitride) and the like.

Figure 6:
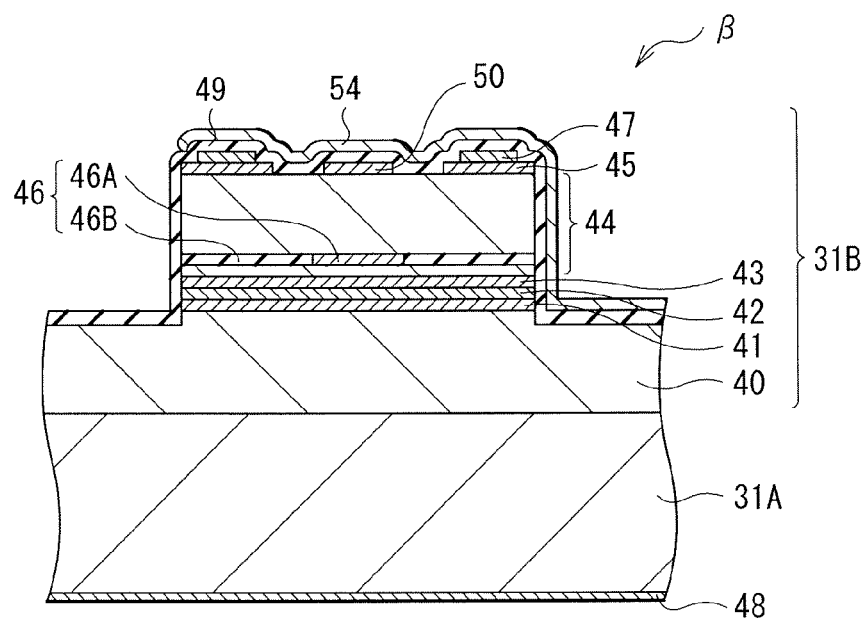
FIG. 6 is a diagram showing another example of a cross-sectional structure of the temperature detecting section illustrated in FIG. 1.

It is to be noted that the phase adjustment layer 50 may be provided at the temperature detecting section 32 as well. In such a case, however, since laser oscillation arises in the temperature detecting section 32, resulting in a laser beam being output externally, a metallic layer 54 may be preferably provided over a whole area of the top surface of the temperature detecting section 32 to prevent any leakage of a laser beam to the outside, for example, as shown in FIG. 6. Alternatively, the metallic layer 54 may be provided over a whole area of the top surface of the temperature detecting section 32 illustrated in FIG. 4 (not shown in the figure). In such a case, even low-intensity light such as an optical power output from an LED is shut off by the metallic layer 54. Accordingly, it may be preferable to provide the metallic layer 54 in any application involving an optical output with low noise.

Meanwhile, in a surface-emitting type semiconductor laser, laser oscillation is typically performed at a current of about 3 mA. Similarly, in the above-described laser structure section 31B as well, laser oscillation is performed at a current of about 3 mA irrespective of the presence or absence of the phase adjustment layer 50. On the contrary, although the temperature detecting section 32 has the same structure as a semiconductor portion of the laser structure section 31B in a semiconductor portion thereof, the low-reflectivity layer 53 on the top surface of the temperature detecting section 32 prevents laser oscillation from being performed at a current of about 3 mA. As a result, even when a current of about 3 mA is flowing, the temperature detecting section 32 keeps a non-oscillating state, and thus a resistance of the temperature detecting section 32 is stabilized at a higher value than a value during oscillation. Therefore, when the temperature of the substrate 31A or the device temperature of the semiconductor laser unit 1 varies, and a voltage of the temperature detecting section 32 varies with such a change in the temperature, such a change in the voltage is also stabilized.

Figure 7:
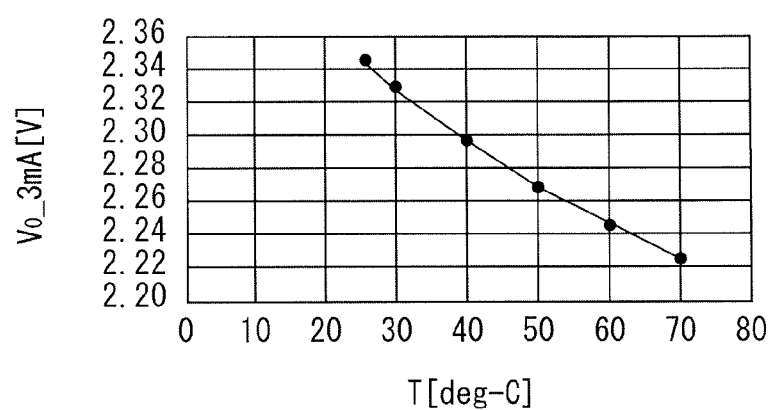
FIG. 7 is a graph showing an example of output voltage characteristics of the temperature detecting section illustrated in FIG. 1.

In the event of variation in the temperature of the substrate 31A or the device temperature of the semiconductor laser unit 1 when a constant current of about 3 mA is applied to the temperature detecting section 32, a change in the voltage as shown in an example in FIG. 7 may arise in the temperature detecting section 32. A slope of such a change in the voltage is almost constant without any variation among the individual temperature detecting sections 32. In some cases, however, the voltage value itself may vary among the individual temperature detecting sections 32. For example, this variation may arise because a resistance of the temperature detecting section 32 will change over time due to application of a current to the temperature detecting section 32 over an extended period of time. Accordingly, the temperature detecting section 32 may be preferably driven in a manner of reducing the time taken for application of a current to the temperature detecting section 32 as much as possible. For example, a driver for driving the temperature detecting section 32, and a circuit (temperature monitoring circuit) for monitoring an output voltage from the temperature detecting section 32 may be provided within the laser driving circuit 20.

[Laser Driving Circuit 20]

Next, the description is provided on the laser driving circuit 20. The laser driving circuit 20 drives the laser structure section 31B in a voltage driving method. The laser driving circuit 20 feeds a drive current Io to be supplied to the laser structure section 31B back to the input side, and compares the drive current Io with a reference current Iref that is used as a reference for a drive current at the light-emission time of the laser structure section 31B, thereby controlling the drive current Io. The laser driving circuit 20 carries out not only such a feedback control but also a feedforward control. Here, the "feedforward control" refers to a control of the drive current Io in a manner of adding a correction current Ias that makes a waveform of an optical output similar to a rectangular waveform to not only the drive current Io but also the reference current Iref in the event of variation in the waveform of an optical output from the laser structure section 31B due to a change in device temperature T and the like. Hereinafter, the detailed description is provided on the feedback control and the feedforward control in the laser driving circuit 20.

First, the description is provided on a circuit configuration of the laser driving circuit 20. FIG. 8 shows an example of a configuration for the laser driving circuit 20. The laser driving circuit 20 may have, for example, a light-emitting control circuit 210, a driving circuit 220, a detecting circuit 230, a detecting circuit 240, and a control voltage generating circuit 250. Reference numerals A1 to A13 denoted in FIG. 8 are assigned to clarify a connection relationship among circuits in FIG. 9, FIGS. 11 to 13, and FIG. 15 to be hereinafter described. The driving circuit 220 corresponds to a specific but not limitative example of a "driving circuit" of the present technology. The detecting circuit 230 corresponds to a specific but not limitative example of a "first detecting circuit" of the present technology. The detecting circuit 240 corresponds to a specific but not limitative example of a "second detecting circuit" of the present technology.

Figure 9:
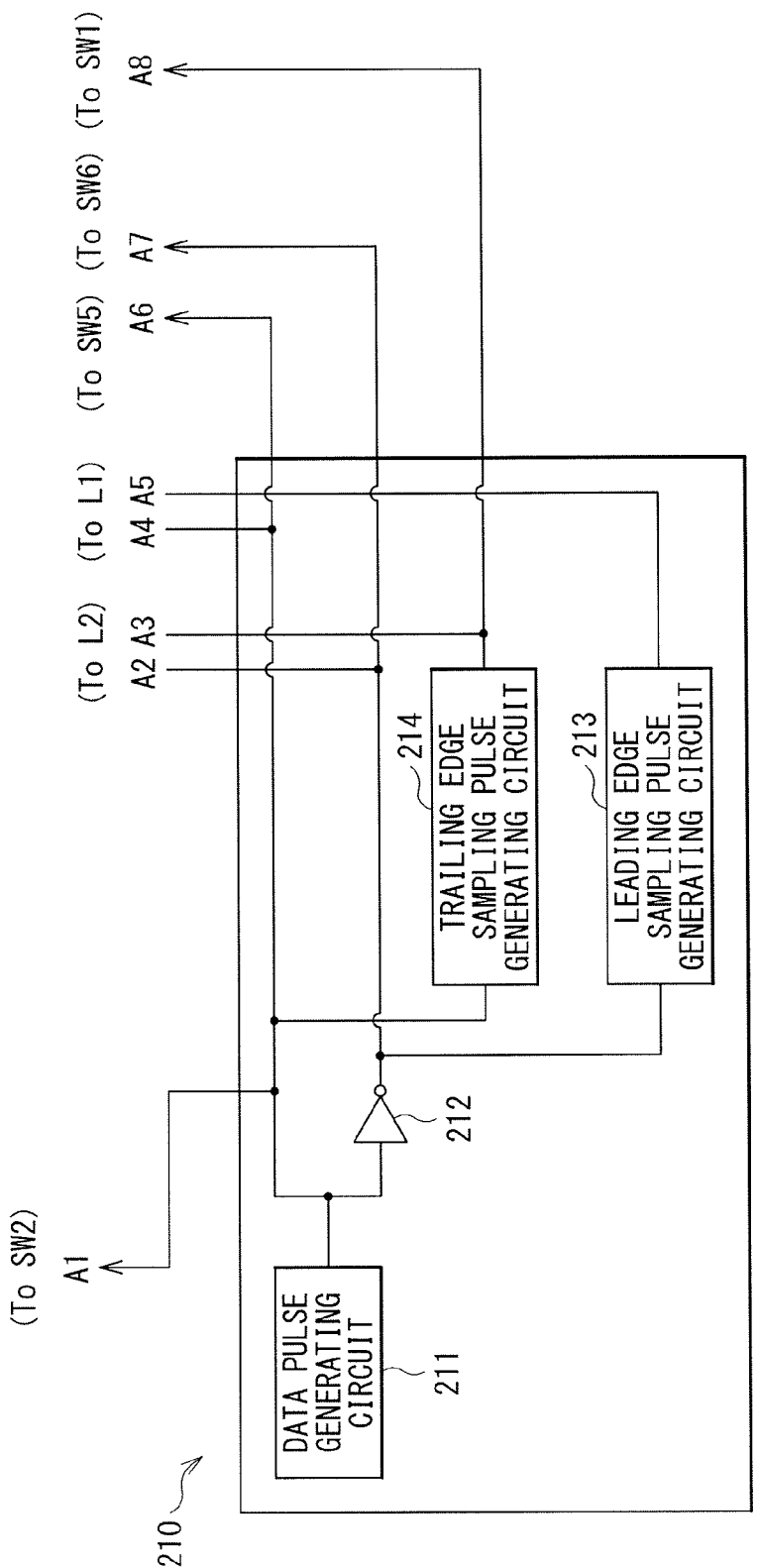
FIG. 9 is a schematic block diagram showing an example of a simplified configuration of a light-emitting control circuit illustrated in FIG. 8.

The light-emitting control circuit 210 allows the drive current Io to be provided from the driving circuit 220 to the laser structure section 31B by controlling the driving circuit 220, the detecting circuit 230, the detecting circuit 240, and the control voltage generating circuit 250. It is to be noted that the laser structure section 31B is represented equivalently by a parallel circuit of a light-emission resistor Ract and a parasitic capacitor Ca (this equivalent circuit is not shown in the drawing). As shown in FIG. 9, for example, the light-emitting control circuit 210 may have a data pulse generating circuit 211, an inverter circuit 212, a leading edge sampling pulse generating circuit 213, and a trailing edge sampling pulse generating circuit 214.

The data pulse generating circuit 211 outputs a data pulse DP as a control pulse. The data pulse DP is a control pulse for switching a light-emission period when the laser structure section 31B emits light and a standby period when the laser structure section 31B is put into a non-light-emission standby state. The inverter circuit 212 outputs an inverting data pulse xDP that is obtained by inverting a signal level of the data pulse DP.

Figure 10:
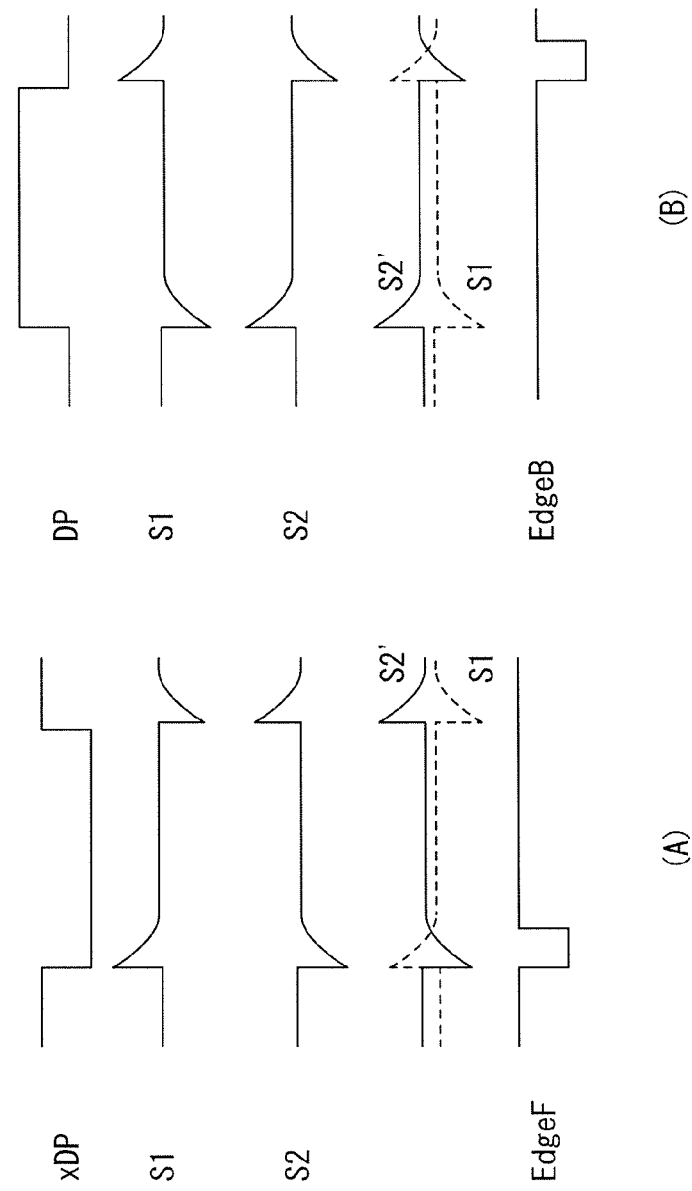
FIGS. 10A and 10B are each a timing chart showing an example of a waveform internal to a leading edge sampling pulse generating circuit and a trailing edge sampling pulse generating circuit illustrated in FIG. 9.

The leading edge sampling pulse generating circuit 213 starts in synchronization with start timing t1 (to be hereinafter described) of the light-emission period to generate a pulse with a predetermined duration (for example, about 10 nsec) (hereinafter referred to as a "leading edge sampling pulse EdgeF") based on the inverting data pulse xDP. As shown in FIG. 10A, for example, the leading edge sampling pulse generating circuit 213 uses a differentiating circuit to generate a first differential signal S1 that is generated by differentiating the inverting data pulse xDP and a second differential signal S2 that is generated by differentiating the inverting data pulse xDP after inversion of this pulse. Further, the leading edge sampling pulse generating circuit 213 generates a shift signal S2' by shifting a level of the second differential signal S2 to a positive side using a shift circuit, and compares the shift signal S2' with the first differential signal S1 using a comparator, thereby generating the leading edge sampling pulse EdgeF.

The trailing edge sampling pulse generating circuit 214 starts in synchronization with end timing t3 (to be hereinafter described) of the light-emission period to generate a pulse with a predetermined duration (for example, about 10 nsec) (hereinafter referred to as a "trailing edge sampling pulse EdgeB") based on the data pulse DP. As shown in FIG. 10B, for example, the trailing edge sampling pulse generating circuit 214 uses a differentiating circuit to generate a first differential signal S1 that is generated by differentiating the data pulse DP and a second differential signal S2 that is generated by differentiating the data pulse DP after inversion of this pulse. Further, the trailing edge sampling pulse generating circuit 214 generates a shift signal S2' by shifting a level of the second differential signal S2 to a positive side using a shift circuit, and compares the shift signal S2' with the first differential signal S1 using a comparator, thereby generating the trailing edge sampling pulse EdgeB.

Figure 11:
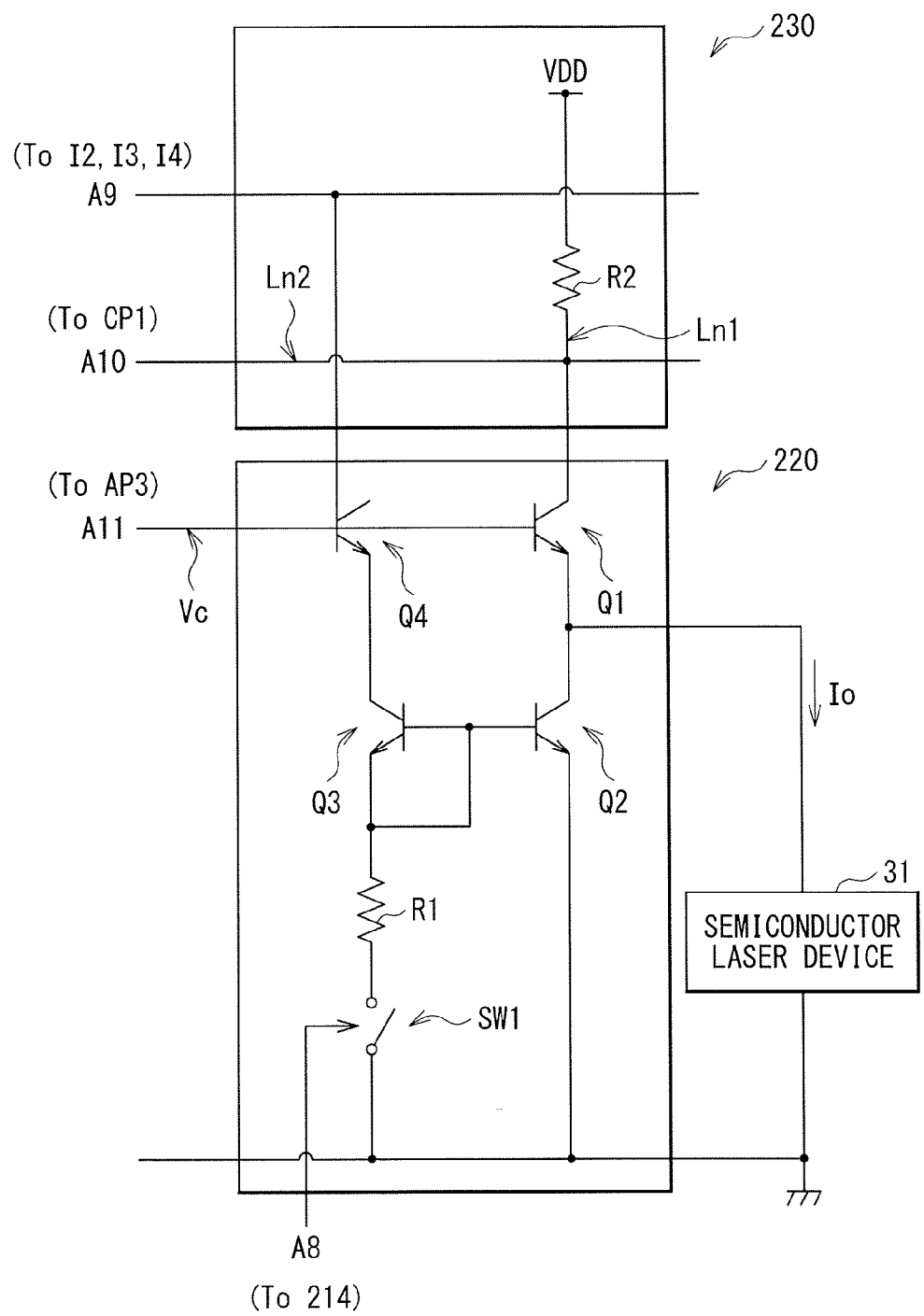
FIG. 11 is a circuit diagram showing an example of a simplified configuration of a driving circuit and a post-stage detecting circuit illustrated in FIG. 8.

The driving circuit 220 provides the drive current Io according to a magnitude of a control voltage Vc incoming from the control voltage generating circuit 250 to a semiconductor laser device 31 (laser structure section 31B). As shown in FIG. 11, for example, the driving circuit 220 may have a transistor Q1 (emitter follower) that provides the drive current Io to the semiconductor laser device 31 (laser structure section 31B). Further, as shown in FIG. 11, for example, the driving circuit 220 may also have a transistor Q2 (emitter follower) that discharges an electrical charge stored in the parasitic capacitor Ca on the semiconductor laser device 31 (laser structure section 31B). The transistor Q1 may be configured of, for example, an NPN-type transistor. The transistor Q2 may be configured of, for example, a PNP-type transistor. Between the transistor Q1 and the transistor Q2, their own emitters are connected with each other.

Types of the drive current Io may include a light-emission current Ion, a bias current Ioff, and the like. The light-emission current Ion is a drive current at the light-emission time of the laser structure section 31B. In concrete terms, the light-emission current Ion is a current necessary for emitting a laser beam out of the laser structure section 31B, and is a current of a value according to the intensity of a laser beam to be emitted out of the laser structure section 31B. The bias current Ioff is a drive current at the non-light-emission time of the laser structure section 31B. In concrete terms, the bias current Ioff is a current that is provided to the laser structure section 31B at the time when a light-emitting control is not performed, and is a current that is provided to the laser structure section 31B to suppress a delay in light emission by the laser structure section 31B. The bias current Ioff is a current of a value smaller than a threshold current of the laser structure section 31B.

The driving circuit 220 may have, for example, an NPN-type transistor Q3 that forms a current mirror circuit together with the transistor Q2, and a PNP-type transistor Q4 whose emitter is connected to an emitter of the transistor Q3 with each other. The control voltage Vc is input to a base of the transistor Q4. Further, the driving circuit 220 has a resistor R1 and a switch Sw3 that are connected in series with each other between a collector of the transistor Q3 and a ground GND. When the switch Sw3 is put into a short-circuited state, and the collector of the transistor Q3 is connected with the ground GND, the transistor Q2 operates as a emitter follower to discharge an electrical charge stored in the parasitic capacitor Ca on the laser structure section 31B.

The detecting circuit 230 detects the drive current Io or a physical quantity corresponding thereto. As shown in FIG. 11, for example, the detecting circuit 230 may have a resistor R2 that is connected with a collector of the transistor Q1 and a high-voltage line VDD, as well as a detecting line Ln2 that is connected with wiring Ln1 between the resistor R2 and the collector of the transistor Q1. The detecting circuit 230 may output, for example, a voltage corresponding to the drive current Io to the control voltage generating circuit 250 via the detecting line Ln2. It is to be noted that the detecting circuit 230 may be provided with a current mirror circuit that is configured of transistors at a connecting point of the detecting line Ln2 and the wiring Ln1. On this occasion, the detecting line Ln2 is connected with a base of the transistor.

The detecting circuit 240 detects a reference current Iref that is used as a reference for the drive current Io or a physical quantity corresponding thereto. The reference current Iref includes a light-emission reference current Ion_ref that is used as a reference for the light-emission current Ion, and a bias reference current Ioff_ref that is used as a reference for the bias current Ioff. The light-emission reference current Ion_ref corresponds to a specific but not limitative example of a "first reference current" of the present technology. The bias reference current Ioff_ref corresponds to a specific but not limitative example of a "second reference current" of the present technology. The light-emission reference current Ion_ref is a current equivalent to a current that is obtained by adding the bias reference current Ioff_ref, a current Isw that is generated by a current source (first current source) within a reference voltage arithmetic circuit 255, and a current IA that is generated by a current source (second current source) within the reference voltage arithmetic circuit 255 with one another.

Figure 12:
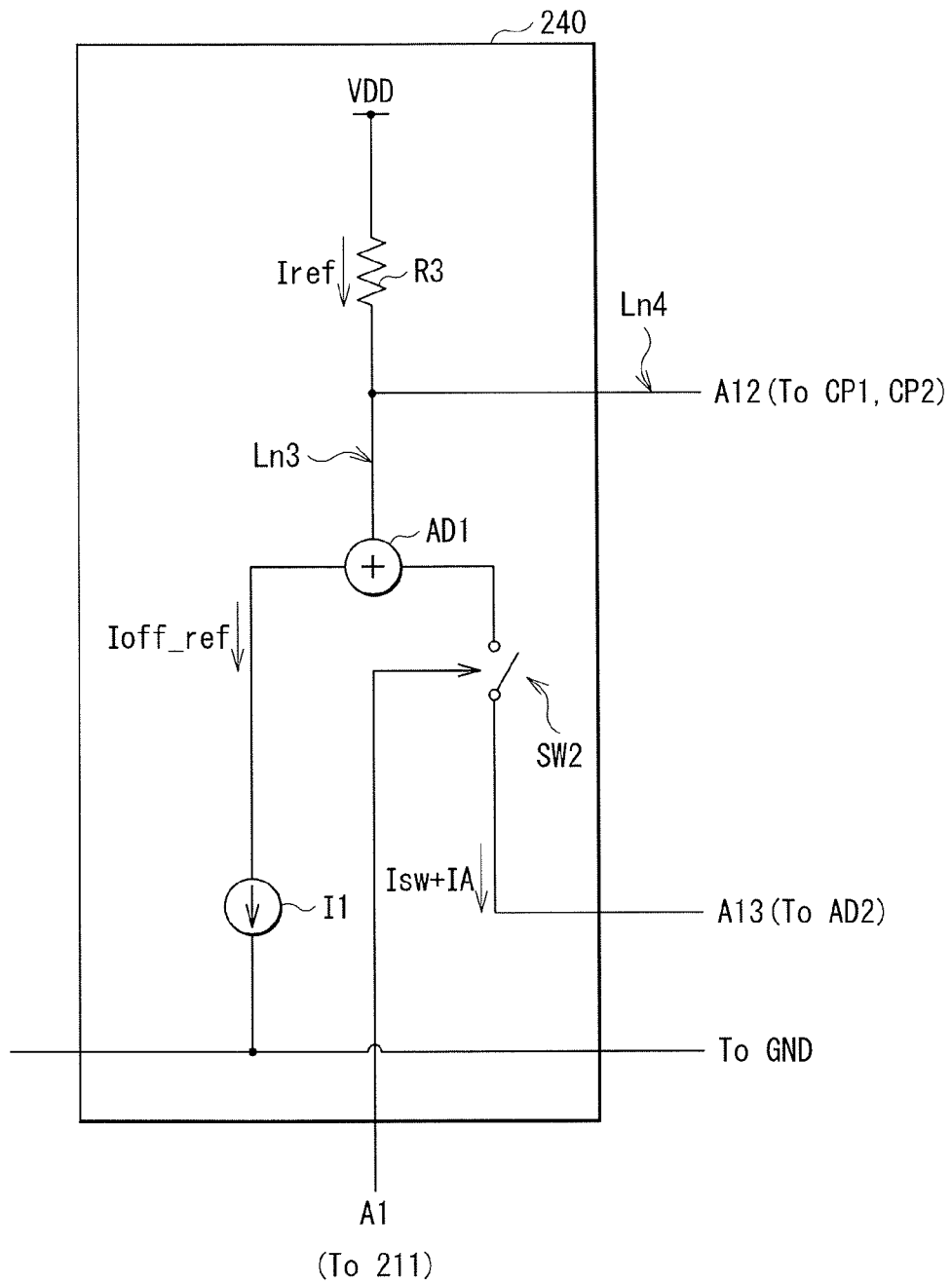
FIG. 12 is a circuit diagram showing an example of a simplified configuration of a pre-stage detecting circuit illustrated in FIG. 8.

As shown in FIG. 12, for example, the detecting circuit 240 may have a current source I1 that generates the bias reference current Ioff_ref, and a switch SW2 that is connected with an adder AD2 within the control voltage generating circuit 250. Further, the detecting circuit 240 may have, for example, an adder AD1, a wiring Ln3 for connecting the adder AD1 and the high-voltage line VDD with each other, a resistor R3 that is inserted within the wiring Ln3, and a detecting line L4 that is connected with a part between the resistor R3 and the adder AD1 on the wiring Ln3. The adder AD1 corresponds to a specific but not limitative example of a "first adding circuit" of the present technology. It is to be noted that the detecting circuit 240 may be provided with a current mirror circuit that is configured of transistors at a connecting point of the detecting line Ln4 and the wiring Ln3. On this occasion, the detecting line Ln4 is connected with a base of the transistor.

When the switch SW2 is put into a short-circuited state, the adder AD1 adds a current at the current source I1 side (bias reference current Ioff_ref) and a current at the switch SW2 side (switching current Isw plus assist current IA) with each other. A current that is generated by the adder AD1 is the light-emission reference current Ion_ref. The light-emission reference current Ion_ref flows through the resistor R3 that is connected with the adder AD1. It is to be noted that the switching current Isw is a current equivalent to a basic current Iop minus a basic current Ib. Further, when the switch SW2 remains in an open state, the adder AD1 applies the current at the current source I1 side (bias reference current Ioff_ref) across the resistor R3. The current at the switch SW2 side (switching current Isw plus assist current IA) corresponds to a specific but not limitative example of a "third reference current" of the present technology.

The basic current Iop takes a value obtained at the time when an automatic power control (APC) loop operation is performed in a state where a current detected by the detecting circuit 230 and a current detected by the detecting circuit 240 have a predetermined relationship. The "APC" refers to a control which is carried out to ensure that a laser beam with the proper intensity is irradiated to an object to be illuminated by detecting an output from the laser structure section 31B. The "predetermined relationship" may refer to, for example, a relationship where a current detected by the detecting circuit 230 becomes equal to a current detected by the detecting circuit 240, or becomes equal to a value of n times (n is a positive integer) greater than a current detected by the detecting circuit 240. The control voltage generating circuit 250 has an internal current source that generates the basic current Iop or a current with a value of 1/n times (n is a positive integer) greater than the basic current Iop. When the above-described "predetermined relationship" refers to the former relationship, the control voltage generating circuit 250 has an internal current source that generates the basic current Iop. On the other hand, when the above-described "predetermined relationship" refers to the latter relationship, the control voltage generating circuit 250 has an internal current source that generates the current with a value of 1/n times (n is a positive integer) greater than the basic current Iop. The basic current Ib takes a value that is set up as a fixed value, or a value that is set up as an automatic bias current in a manner of calculating a threshold current of the laser structure section 31B by performing the APC loop operation with two kinds of optical outputs and then offsetting the resultant threshold current. The control voltage generating circuit 250 has an internal current source that generates the basic current Ib.

During a non-light-emission period of the laser structure section 31B, the control voltage generating circuit 250 compares a detection result from the detecting circuit 230 and a detection result from the detecting circuit 240 with each other, and outputs a basic voltage Vb obtained according to the comparison result as a control voltage Vc. The basic voltage Vb that is output during the non-light-emission period of the laser structure section 31B becomes the control voltage Vc at the non-light-emission time of the laser structure section 31B. Further, during a light-emission period of the laser structure section 31B, the control voltage generating circuit 250, in the first place, generates an additive voltage Vad (Vop plus Vas) by adding a basic voltage Vop that is obtained according to a comparison result derived in the same manner as above and a correction voltage Vas that is derived by a predetermined arithmetical operation with each other. Next, the control voltage generating circuit 250 outputs the additive voltage Vad as the control voltage Vc. The additive voltage Vad that is output during the light-emission period of the laser structure section 31B becomes the control voltage Vc at the light-emission time of the laser structure section 31B.

As shown in FIG. 13, for example, the control voltage generating circuit 250 may have a comparator circuit 251, a correction voltage arithmetic circuit 252, a correction voltage adding circuit 253, a selection circuit 254, and a reference voltage arithmetic circuit 255. A circuit including the comparator circuit 251, the correction voltage arithmetic circuit 252, the correction voltage adding circuit 253, and the selection circuit 254 corresponds to a specific but not limitative example of a "first generating circuit" of the present technology. The reference voltage arithmetic circuit 255 corresponds to a specific but not limitative example of a "second generating circuit" of the present technology.

The comparator circuit 251 compares a detection result from the detecting circuit 230 and a detection result from the detecting circuit 240 with each other, and outputs a voltage according to the comparison result. In concrete terms, the comparator circuit 251 compares a voltage according to a value of the drive current Io that is detected in the detecting circuit 230 and a voltage according to a value of the reference current Iref that is detected in the detecting circuit 240 with each other, and outputs a voltage according to the comparison result. On this occasion, the comparator circuit 251 may compare a value of n times (n is a positive integer) greater than the reference current Iref and a value of the drive current Io with each other to output a voltage according to the comparison result. This is an illustrative embodiment that the comparator circuit 251 is capable of adopting when the above-described "predetermined relationship" refers to a relationship where the basic current Iop becomes equal to a value of n times (n is a positive integer) greater than the reference current Iref. In such a case, it is possible to decrease a current flowing in the detecting circuit 240, which allows a power consumption to be reduced. The comparator circuit 251 may have a comparator CP1 that compares, for example, a voltage according to a value of the drive current Io that is detected in the detecting circuit 230 and a voltage according to a value of the light-emission reference current Ion_ref that is detected in the detecting circuit 240 with each other. Further, the comparator circuit 251 may also have a comparator CP2 that compares, for example, a voltage according to a value of the drive current Io that is detected in the detecting circuit 230 and a voltage according to a value of the bias reference current Ioff_ref that is detected in the detecting circuit 240 with one another.

The comparator circuit 251 has a switch SW3 that is provided at wiring Ln5 for providing an operating current to the comparator CP1, and a current source I2 that is coupled to the wiring Ln5. The comparator circuit 251 has a switch SW4 that is provided at wiring Ln6 for providing an operating current to the comparator CP2, and a current source I3 that is coupled to the wiring Ln6. The comparator circuit 251 has a logic circuit L1 that performs on/off control of the switch SW3, and a logic circuit L2 that performs on/off control of the switch SW4. The logic circuit L1 is an AND circuit. The logic circuit L2 is an AND circuit in which an NOT circuit is connected with only one of two inputs. The comparator circuit 251 has a transistor Q5 that is connected with an output wiring Ln7 of the comparator CP1, and a transistor Q6 that is connected with an output wiring Ln8 of the comparator CP2. The comparator circuit 251 has a capacitor element C1 that is connected with the output wiring Ln7, and a capacitor element C2 that is connected with the output wiring Ln8. The output wiring Ln7 is connected with a base of the transistor Q5. The output wiring Ln8 is connected with a base of the transistor Q6. An emitter of the transistor Q5 is connected with the correction voltage adding circuit 253, and is further connected with the correction voltage arithmetic circuit 252 and the reference voltage arithmetic circuit 255 as well. A collector of the transistor Q5 is connected with the ground GND. On the other hand, for the transistor Q6, an emitter thereof is connected with a current source 14, and a collector thereof is connected with the ground GND.

For the comparator CP1, as shown in (A) of FIG. 14, when an output of the logic circuit L1 is placed in H level, the switch SW3 is put into a short-circuited state, and the comparator CP1 operates using an operating current provided from the current source I2 to output a voltage Vco1 according to a comparison result. Hereupon, the capacitor element C1 for holding a voltage is connected with an output node of the comparator CP1. In the event of stoppage of a comparative operation that is performed by the comparator CP1, the capacitor element C1 holds the voltage Vco1 just before such a stoppage as a holding voltage Vco1'. The capacitor element C1 is capable of holding the holding voltage Vco1' until the next comparative period with capacitance in the order of several tens of picofarads because it is connected with a base of the transistor Q5. As shown in (A) of FIG. 14, the stoppage of a comparative operation that is performed by the comparator CP1 is executed when an output of the logic circuit L1 is placed in L level, and otherwise the comparative operation would be carried out continuously.

On the other hand, for the comparator CP2, as shown in (B) of FIG. 14, when an output of the logic circuit L2 is placed in H level, the switch SW4 is put into a short-circuited state, and the comparator CP2 operates using an operating current provided from the current source I3 to output a voltage Vco2 according to a comparison result. Hereupon, the capacitor element C2 for holding a voltage is connected with an output node of the comparator CP2. In the event of stoppage of a comparative operation that is performed by the comparator CP2, the capacitor element C2 holds the voltage Vco2 just before such a stoppage as a holding voltage Vco2'. The capacitor element C2 is capable of holding the holding voltage Vco2' until the next comparative period with capacitance in the order of several tens of picofarads because it is connected with a base of the transistor Q6. As shown in (B) of FIG. 14, the stoppage of a comparative operation that is performed by the comparator CP2 is executed when an output of the logic circuit L2 is placed in L level, and otherwise the comparative operation would be carried out continuously.

The comparator circuit 251 generates the basic voltage Vop according to a magnitude of the voltage Vco1 that is input to a base of the transistor Q5. The resulting basic voltage Vop is provided to the correction voltage arithmetic circuit 252, the correction voltage adding circuit 253, and the reference voltage arithmetic circuit 255. Further, the comparator circuit 251 generates the basic voltage Vb according to a magnitude of the voltage Vco2 that is input to a base of the transistor Q6. The resulting basic voltage Vb is provided to an input of an amplifier AP2 in the selection circuit 254. Therefore, the comparator circuit 251 generates and outputs the basic voltage Vb as the control voltage Vc at the non-light-emission time of the laser structure section 31B.

When the data pulse DP is placed in H level, the correction voltage arithmetic circuit 252 generates a correction voltage Vas using the basic voltage Vop, the basic voltage Vb, and the switching current Isw to output the generated correction voltage Vas to the correction voltage adding circuit 253. In concrete terms, when the data pulse DP is placed in H level, the correction voltage arithmetic circuit 252 first derives the light-emission resistance Ract of the laser structure section 31B using values of the basic voltage Vop and the basic voltage Vb that are output from the comparator circuit 251, as well as a value of the switching current Isw. The light-emission resistance Ract is derived from Expression 1 given below.

$$Ract = (Vop - Vb)/Isw = Vsw/Isw \qquad \text{[Expression 1]}$$

Here, symbols Vop and Vb in Expression 1 are values that are output from the comparator circuit 251 in a temporally precedent feedback loop operation. Further, a symbol Isw in Expression 1 is a value that is derived using Top and Ib during the temporally precedent feedback loop operation. In other words, Ract is replaced with voltage and current values that are internally owned within the laser driving circuit 20.

Next, the correction voltage arithmetic circuit 252 generates the correction voltage Vas using a correction resistance that is obtained by correcting the light-emission resistance Ract by the use of an optional resistor Ra. In calculating the correction voltage Vas, the correction voltage arithmetic circuit 252 first calculates a maximum value VAmax of the correction voltage Vas. The VAmax is derived from Expression 2 given below.

$$VAmax = IAmax \times Ract \qquad \text{[Expression 2]}$$
$$= IAmax \times Vsw/Isw$$

A right-hand side in Expression 2 is multiplication of voltage and current values. Consequently, the correction voltage arithmetic circuit 252 replaces Vsw with a current value using the optional resistor Ra (not shown in the drawing) within the laser driving circuit 20 to ensure that a right-hand side in Expression 2 is multiplication of current and resistance values (see Expression 3). As a result, VAmax is derived from Expression 4 given below. The correction voltage arithmetic circuit 252 calculates the maximum value VAmax of the correction voltage Vas by converting a current of a value obtained by multiplying IAmax derived from Expression 5 and a current ratio of (Isw'/Isw) with each other into a voltage in a manner of applying such a current across the optional resistor Ra that is an internal resistor within the laser driving circuit 20. The multiplication of IAmax and (Isw'×Isw) is executable using a multiplier. It is to be noted that the above-described correction resistance is equivalent to "(Isw'×Isw)× Ra" at a right-hand side in Expression 4.

$$Vsw = Isw' \times Ra \qquad \text{[Expression 3]}$$

$$VAmax = IAmax \times (Isw' \times Ra)/Isw \qquad \text{[Expression 4]}$$
$$= IAmax \times (Isw'/Isw) \times Ra$$

$$IAmax = (k - mT) \times (Isw - Iswo) + IAo \qquad \text{[Expression 5]}$$

Symbols k, m, Iswo, and IAo in Expression 5 are initial setting values and constant values. Here, m is a factor in relation to a current narrowing diameter of the laser structure section 31B (current narrowing diameter of the current narrowing layer 46). k, Iswo, and IAo, which are factors having no correlation with variations in the I-L characteristics of the individual laser structure sections 31B, are fixed values given in common to all the laser structure sections 31B. T is device temperature of the laser structure section 31B.

The correction voltage arithmetic circuit 252 derives the correction voltage Vas using the maximum value VAmax of the correction voltage Vas. The correction voltage Vas (t) is derived from Expression 6 and Expression 7 given below.

$$Vas(t)=IAmax \times g(t) \times (Isw'/Isw) \times Ra \qquad \text{[Expression 6]}$$

$$g(t)=v^* \exp[-t/T_{A1}]+(1-v)^* \exp[-t/T_{A2}] \qquad \text{[Expression 7]}$$

Symbols $T_{A1}$ and $T_{A2}$ in Expression 7 are RC time constant values. For example, as shown in FIG. 15, therefore, a value of IAmax×g(t) may vary according to the RC time constant values ($T_{A1}$ and $T_{A2}$) and temperature information (T). A symbol v in Expression 7, which is a weighting value for a term related to the RC time constant $T_{A1}$, is a value within a range of 0 to 1.

In assuming that the light-emitting control circuit 210 outputs the data pulses DP as control pulses consecutively, the correction voltage arithmetic circuit 252 may further vary IAmax according to other RC time constant values and temperature information (T). This allows the correction voltage arithmetic circuit 252 to adjust IAmax as a value giving consideration to a thermal factor remaining within the laser structure section 31B (within the active layer 42). Hereupon, IAmax is denoted as IAmax (t). On this occasion, Vas (t) and IAmax (t) are represented by the following Expression 8, Expression 9, and Expression 10.

$$Vas(t)=IAmax(t) \times g(t) \times (Isw'/Isw) \times Ra \qquad \text{[Expression 8]}$$

$$IAmax(t)=\{((k-mT) \times (Isw-Iswo)+IAo\} \times (I-f(t)) \qquad \text{[Expression 9]}$$

At on time:

$$u^*[1-\exp(-t/T_{th1})]+(1-u)^*[1-\exp(-t/T_{th2})] \equiv f(t)$$

At off time:

$$u^* \exp(-t/T_{th1})+(1-u)^* \exp(-t/T_{th2}) \equiv f(t) \qquad \text{[Expression 10]}$$

A symbol u in Expression 10, which is a weighting value for a term related to the RC time constant $T_{th1}$, is a value within a range of 0 to 1. A symbol t that is included in a left-hand side in Expression 10 indicates a start timing of on period or a start timing of off period when on/off driving is performed for the laser structure section 31B. Symbols $T_{th1}$ and $T_{th2}$ in Expression 10 are RC time constant values. IAmax (t) varies depending on the RC time constant values ($T_{th1}$ and $T_{th2}$) and temperature information (T).

The above-described correction voltage Vas(t) is intended to correct a waveform at a pulse rising time. The correction voltage arithmetic circuit 252 may further implement measures (correction) against a phenomenon called a "droop" that decreases an optical output gradually due to an increase in the device temperature in association with injection of current pulses into the laser structure section 31B. On this occasion, the correction voltage Vas(t) is represented respectively by the following Expression 11, Expression 12, Expression 13, and Expression 14. It is to be noted that the correction voltage Vas(t) which is represented in Expression 11 is an expression assuming that the light-emitting control circuit 210 outputs the data pulses DP as control pulses consecutively.

$$Vas(t) = \{IAmax(t) \times g(t) + \Delta IAmax\_drp(t) \times h(t)\} \times (Isw'/Isw) \times Ra \qquad \text{[Expression 11]}$$

$$\Delta IAmax\_drp(t) = -A \times (Iop-Idpo)(1-i(t))(Iop>Idpo) \qquad \text{[Expression 12]}$$
$$= 0 (0 \le Iop \le Idpo)$$

$$h(t) = u*\exp(-t/T_{A3})] + (1-u)*\exp[-t/T_{A4}] \qquad \text{[Expression 13]}$$

At on time: $\theta*[1-\exp(-t/T_{th3})]+$ [Expression 14]
$(1-\theta)*[1-\exp(-t/T_{th4})] \equiv i(t)$
At off time: $\theta*\exp(-t/T_{th2})+(1-\theta)*\exp(-t/T_{th4}) \equiv i(t)$ A symbol Idpo in Expression 12 is a minimum operating current involving a droop correction. A symbol A in Expression 12 is equivalent to C*T–Ao. A symbol C is a factor related to the device temperature T of the laser structure section 31B. A symbol Ao, which is an adjustment parameter, varies depending on I–L linearity of the laser structure section 31B, and the like. Symbols $T_{A3}$ and $T_{A4}$ in Expression 13 are RC time constant values. For example, as shown in FIG. 16, therefore, "ΔIAmax_drp(t)×h(t)" in Expression 11 varies depending on the RC time constant values ($T_{A3}$ and $T_{A4}$) and temperature information (T). A symbol θ in Expression 14 is a weighting value for a term related to the RC time constant $T_{th3}$. A symbol t that is included in a left-hand side in Expression 14 indicates a start timing of on period or a start timing of off period when on/off driving is performed for the laser structure section 31B. Symbols $T_{th3}$ and $T_{th4}$ in Expression 14 are RC time constant values.

Next, the description is provided on the correction voltage adding circuit 253, the selection circuit 254, and the reference voltage arithmetic circuit 255.

The correction voltage adding circuit 253 generates and outputs an additive voltage Vad (Vop plus Vas(t)) that is obtained by adding the basic voltage Vop and the correction voltage Vas(t) derived from the predetermined calculation as referred to above with each other as the control voltage Vc at the light-emission time of the laser structure section 31B.

The selection circuit 254 selects any one of the two kinds of control voltages Vc that are output from the comparator circuit 251 to output the selected voltage to the driving circuit 220. In concrete terms, when the data pulse DP is placed in H level, the selection circuit 254 selects the additive voltage Vad that is output from the comparator circuit 251 as the control voltage Vc to output the selected voltage to the driving circuit 220. Further, when the data pulse DP is placed in L level, the selection circuit 254 selects the basic voltage Vb that is output from the comparator circuit 251 as the control voltage Vc to output the selected voltage to the driving circuit 220.

As shown in FIG. 13, for example, the selection circuit 254 may have an amplifier AP1 that is connected with an output end of the correction voltage adding circuit 253, and an amplifier AP2 that is connected with an emitter of the transistor Q6 in the comparator circuit 251. Further, the selection circuit 254 may also have, for example, a switch SW5 having a first end thereof connected with an output end of the amplifier AP1, a switch SW6 having a first end thereof connected with an output end of the amplifier AP2, and an amplifier AP3 that is connected with a second end of each of the switch SW5 and the switch SW6. An output end of the amplifier AP3 is connected with a gate of the transistor Q4 in the driving circuit 220. On/off operation of the switch SW5 is controlled with the data pulse DP, while on/off operation of the switch SW6 is controlled with the inverting data pulse xDP.

The reference voltage arithmetic circuit 255 generates a current flowing through the switch SW2 by using the additive voltage Vad that is obtained by the correction voltage adding circuit 253, the basic voltage Vop and the basic voltage Vb that are obtained by the comparator circuit 251, and the basic current Ib. The current flowing through the switch SW2 corresponds to a specific but not limitative example of a "third reference current" of the present technology.

The reference voltage arithmetic circuit 255 may have, for example, two current sources and one adder AD2 (second adding circuit). The adder AD2 adds a current that is generated from one current source and a current that is generated from the other current source with each other. A current that is generated by the adder AD2 is a current equivalent to a current that is obtained by subtracting the bias reference current Ioff_ref from the light-emission reference current Ion_ref (that is, a difference between the light-emission reference current Ion_ref and the bias reference current Ioff_ref). This current flows through the switch SW2.

One of the two current source, which is intended to generate the switching current Isw, generates a current equivalent to a current (a difference between Iop and Ib) flowing through the laser structure section 31B when a voltage of a difference between Vop and Vb is applied to the laser structure section 31B (light-emission resistor (Ract)). The other of the two current sources generates a correction current IA. The correction current IA is derived from Expression 15 given below. A symbol VA in Expression 15 is a correction voltage that is obtained by subtracting the basic voltage Vop derived by the comparator circuit 251 from the additive voltage Vad derived by the correction voltage adding circuit 253. Further, a symbol Vsw in Expression 15 is a switching voltage that is obtained by subtracting the basic voltage Vb derived by the comparator circuit 251 from the basic voltage Vop derived by the comparator circuit 251.

$$IA = (VA/Vsw) \times Isw \qquad [\text{Expression 15}]$$
$$= ((Vad - Vop)/Vsw) \times Isw$$
$$= ((Vad - Vop)/(Vop - Vb)) \times Isw$$

[Operation]

Next, the description is provided on an operation of the laser driving circuit 20. As shown in FIG. 14, for example, the operation of the laser driving circuit 20 is divided for each of four processes A, B, C, and D. Hereupon, the process A is a process during a period prior to a start timing t1 of the light-emission period. The process B is a process during a period from the start timing t1 of the light-emission period until a timing t2, that is, a process during a period just after light-emission. The process C is a process during a period from the timing t2 until an end timing t3 of the light-emission period, that is, a process during a period excluding a period just after light-emission over the light-emission period. The process D is a process during a period from the end timing t3 of the light-emission period until a timing t4, that is, a process during a period just after non-light-emission.

(Process A)

During a period of the process A, the laser driving circuit 20 puts the switches SW1, SW2, SW3, and SW5 in off state, and puts the switch SW4 in on state. Accordingly, an operating current is provided to the comparator CP2, and a voltage corresponding to the drive current Io (bias current Ioff) at the non-light-emission time of the laser structure section 31B and a voltage corresponding to the bias reference current Ioff_ref are input to an input end of the comparator CP2. As a result, a voltage Vco2 based on a comparison result is output from the comparator CP2, and the basic voltage Vb corresponding to the voltage Vco2 is input to the laser structure section 31B via the selection circuit 254 and the driving circuit 220. Subsequently, the drive current Io (bias current Ioff) corresponding to the basic voltage Vb further flows through the laser structure section 31B, and a voltage corresponding to the drive current Io (bias current Ioff) at the non-light-emission time of the laser structure section 31B and a voltage corresponding to the bias reference current Ioff_ref are again compared by the comparator CP2. In such a manner, a feedback loop acts on the bias current Ioff, which is asymptotic to the bias reference current Ioff_ref.

(Process B)

During a period of the process B, the laser driving circuit 20 puts the switches SW1, SW3, SW4, and SW6 in off state, and puts the switches SW2 and SW5 in on state. Accordingly, an operating current to be provided to the comparator CP2 stops, resulting in a comparative operation of the comparator CP2 being stopped. Meanwhile, an operating current to be provided to the comparator CP1 also remains in a stopped state, resulting in a comparative operation of the comparator CP1 being stopped as well. Consequently, since a holding voltage co1' that is held by the capacitor element C1 is applied to a base of the transistor Q5, the additive voltage Vad that is obtained by adding the basic voltage Vop and the correction voltage Vas with each other is input to the laser structure section 31B via the selection circuit 254 and the driving circuit 220. Subsequently, the drive current Io (light-emission current Ion) corresponding to the additive voltage Vad further flows through the laser structure section 31B, which starts light emission with a steep rising edge. Thereafter, a voltage corresponding to the drive current Io (light-emission current Ion) at the light-emission time of the laser structure section 31B and a voltage corresponding to the light-emission reference current Ion_ref are input to the comparator CP1. During a period of the process B, however, a comparative operation of the comparator CP1 still stops, and thus a voltage on an output end of the comparator CP1 remains at the holding voltage co1'.

(Process C)

During a period of the process C, the laser driving circuit 20 puts the switches SW1, SW4, and SW6 in off state, and puts the switches SW2, SW3, and SW5 in on state. Accordingly, since an operating current is provided to the comparator CP1, and a comparative operation of the comparator CP1 starts, a voltage on an output end of the comparator CP1 becomes a voltage (voltage Vco1) of a value corresponding to a comparison result from the comparator CP1. Consequently, a voltage (basic voltage Vop) corresponding to the voltage Vco1 is output from the comparator circuit 251, and the additive voltage Vad that is obtained by adding the basic voltage Vop and the correction voltage Vas with each other is input to the laser structure section 31B via the selection circuit 254 and the driving circuit 220. As a result, the drive current Io (light-emission current Ion) corresponding to the additive voltage Vad flows through the laser structure section 31B, and a light-emitting state is maintained in the laser structure section 31B.

Thereafter, when the drive current Io according to a magnitude of the additive voltage Vad is input to the laser structure section 31B, the drive current Io or a physical quantity corresponding thereto is detected by the detecting circuit 230, and a detection result from the detecting circuit 230 is input to the comparator circuit 251. The detection result from the detecting circuit 230 includes a component corresponding to the correction voltage Vas. Therefore, if such a component corresponding to the correction voltage Vas is not included in the detection result from the detecting circuit 240, the comparator circuit 251 outputs a voltage that diminishes the correction voltage Vas.

In this embodiment of the present disclosure, however, a correction voltage VA corresponding to the correction voltage Vas is derived using the additive voltage Vad, the basic voltage Vop, the basic voltage Vb, and the basic current Ib, and a correction current IA is derived using the derived correction voltage VA. A current that is obtained by adding this correction current IA and the switching current Isw with each other is input to the detecting circuit 240. Further, the light-emission reference current Ion_ref is generated by adding a current that is input to the detecting circuit 240 and the bias reference current Ioff_ref with each other. Subsequently, the light-emission reference current Ion_ref is detected by the detecting circuit 240, and a detection result from the detecting circuit 240 is input to the comparator circuit 251. Hereupon, the detection result from the detecting circuit 240 includes a component corresponding to the correction voltage Vas. Therefore, the basic voltage Vop that is generated according to a result of comparing the detection result from the detecting circuit 230 and the detection result from the detecting circuit 240 with each other includes no component that cancels the correction voltage Vas. Accordingly, it is found that a feedback loop acts on the basic voltage Vop or the basic voltage Vb, while does not act on the correction voltage Vas. As a result, the drive current Io (light-emission current Ion) including a component corresponding to the correction voltage Vas flows through the laser structure section 31B, and a waveform of a light-emitting pulse at the laser structure section 31B becomes similar to a rectangular waveform.

(Process D)

During a period of the process D, the laser driving circuit 20 puts the switches SW2, SW3, SW4, and SW5 in off state, and puts the switches SW1 and SW6 in on state. Accordingly, an operating current to be provided to the comparator CP1 stops, resulting in a comparative operation of the comparator CP1 being stopped. Meanwhile, an operating current to be provided to the comparator CP2 also remains in a stopped state, resulting in a comparative operation of the comparator CP2 being stopped as well. Consequently, since a holding voltage co2' that is held by the capacitor element C2 is applied to a base of the transistor Q6, the basic voltage Vb is input to the laser structure section 31B via the selection circuit 254 and the driving circuit 220. Subsequently, the drive current Io (bias current Ioff) corresponding to the basic voltage Vb further flows through the laser structure section 31B, which starts a non-light-emission operation with a steep rising edge. Thereafter, a voltage corresponding to the drive current Io (bias current Ioff) at the non-light-emission time of the laser structure section 31B and a voltage corresponding to the bias reference current Ioff_ref are input to the comparator CP2. During a period of the process D, however, a comparative operation of the comparator CP2 still stops, and thus a voltage on an output end of the comparator CP2 remains at the holding voltage co2'.

ADVANTAGEOUS EFFECTS

Next, the description is provided on advantageous effects of the laser driving circuit 20.

A surface-emitting laser may have a light-emission resistance of nearly about 100 ohms that is larger by an order of magnitude as compared with an edge-emitting laser, as well as a larger parasitic capacitance that may be increased due to a multichannel configuration. In addition, the light-emission resistance of the surface-emitting laser may vary due to any change in temperature that could be caused by light emission, resulting in variation in the light-emission characteristics. Consequently, in the surface-emitting laser, stabilization of the light-emission characteristics has been often attempted using a current driving method instead of a voltage driving method that could be influenced by variation in the light-emission resistance. In the surface-emitting laser, however, the rising characteristics (TR characteristics) and the falling characteristics (TF characteristics) that are not significantly influenced in the edge-emitting laser may depend on a time constant that is determined by the light-emission resistance and parasitic capacitance. In the current driving method, therefore, a waveform of a driving signal for driving the surface-emitting laser would lose steep rising/falling edges.

Various driving methods have been typically proposed to deal with such a disadvantage, although each of those methods has been disadvantageous in that a control thereof may be lacking in the effectiveness due to the excessive complexity. Consequently, a method has been proposed that makes the TR characteristics and the TF characteristics of a drive current steep in a voltage driving method, as well as maintaining the drive current at a constant value irrespective of any variation in the light-emission resistance. However, if a correction current is added to a drive current to maintain the drive current at a constant value, a feedback loop attempts to reduce the correction current, which has caused a disadvantage that it is difficult to perform an accurate correction on the drive current.

On the contrary, in the laser driving circuit 20 according to this embodiment of the present disclosure, the drive current Io is specified by the control voltage Vc (additive voltage Vad) that is generated by adding the basic voltage Vop and the correction voltage Vas with each other. Further, the basic voltage Vop is generated according to a result of comparing the reference current (current equivalent to a difference between the light-emission reference current Ion_ref and the bias reference current Ioff_ref) that is generated using the control voltage Vc (additive voltage Vad) and the drive current Io with each other. Consequently, a feedback loop acts on the basic voltage Vop, while does not act on the correction voltage Vas. Therefore, it is possible to correct a waveform of the control voltage Vc using the correction voltage Vas in such a manner that a pulse waveform of an optical output from the laser structure section 31B becomes similar to a rectangular waveform. As a result, this allows to perform an accurate correction on the drive current in the voltage driving method.

2. Modification Example

In the above-described embodiment of the present disclosure, although the detecting circuit 240 is provided with the current source that generates the bias reference current Ioff_ref, such a current source may be omitted. On this occasion, a switch SW7 may be provided at a location where the current source has been provided, and the switch SW7 may be controlled with the data pulse DP. Even in such a case, as with the above-described embodiment of the present disclosure, it is possible to perform an accurate correction on the drive current in the voltage driving method.

It is to be noted that in connection with the omission of the current source that generates the bias reference current Ioff_ref, a detection result from the detecting circuit 240 includes no component of the bias reference current Ioff_ref. Accordingly, in this modification example, it should be assumed that the bias reference current Ioff_ref, the basic current Ib, and the basic voltage Vb are negligible small values, or are equal to zero, and it is necessary to interchange the descriptions in the above-described embodiment of the present disclosure based on this assumption.

Although the present technology is described thus far with reference to the embodiment and modification example thereof, the present technology is not limited to the above-described embodiment and the like, but different variations are available.

Further, for example, the present technology may be configured as follows.

(1) A driving device, including:

a driving circuit configured to provide a drive current depending on a magnitude of a control voltage to a light-emitting element;

a first detecting circuit configured to detect the drive current or a physical quantity corresponding thereto;

a second detecting circuit configured to detect a first reference current to be used as a reference for a drive current at a light-emission time of the light-emitting element or a physical quantity corresponding thereto, as well as a second reference current to be used as a reference for a drive current at a non-light-emission time of the light-emitting element or a physical quantity corresponding thereto;

a first generating circuit configured to generate an additive voltage obtained by adding a first voltage and a correction voltage with each other as a control voltage at the light-emission time of the light-emitting element, and further to generate a second voltage that is derived according to a result of comparing a detection result from the first detecting section at the non-light-emission time of the light-emitting element and a detection result from the second detecting section at the non-light-emission time of the light-emitting element as a control voltage at the non-light-emission time of the light-emitting element, the first voltage being derived according to a result of comparing a detection result from the first detecting section at the light-emission time of the light-emitting element and a detection result from the second detecting section at the light-emission time of the light-emitting element, the correction voltage being derived by a predetermined calculation; and a second generating circuit configured to generate a third reference current that is equivalent to a difference between the first reference current and the second reference current by using the control voltage at the light-emission time of the light-emitting element, the first voltage, the second voltage, and the second reference current, wherein the second detecting circuit has a first adder circuit that generates the first reference current by adding the second reference current and the third reference current with each other.

(2) The driving device according to (1), wherein the second generating circuit includes:

a first current source configured to generate a first current with a magnitude corresponding to a current at the time when a voltage equivalent to a difference between the first voltage and the second voltage is applied to the light-emitting element;

a second current source configured to generate a second current equivalent to a difference between the third reference current and the first current; and a second adder circuit adding the first voltage and the second voltage with each other.

(3) The driving device according to (1) or (2), wherein the first generating circuit generates the correction voltage using values of the first voltage, the second voltage, and the first current.

(4) The driving device according to any one of (1) to (3), wherein the first generating circuit derives a light-emission resistance of the light-emitting element using values of the first voltage, the second voltage, and the first current, and generates the correction voltage using a correction resistance that is obtained by correcting the light-emission resistance by the use of an optional resistor.

(5) The driving device according to (4), wherein the first generating circuit generates the correction voltage by multiplying the correction resistance and a current varying depending on RC time constant values and temperature information with each other.

(6) A light-emitting unit, including:

a light-emitting element;

a driving circuit configured to provide a drive current depending on a magnitude of a control voltage to the light-emitting element;

a first detecting circuit configured to detect the drive current or a physical quantity corresponding thereto;

a second detecting circuit configured to detect a first reference current to be used as a reference for a drive current at a light-emission time of the light-emitting element or a physical quantity corresponding thereto, as well as a second reference current to be used as a reference for a drive current at a non-light-emission time of the light-emitting element or a physical quantity corresponding thereto;

a first generating circuit configured to generate an additive voltage obtained by adding a first voltage and a correction voltage with each other as a control voltage at the light-emission time of the light-emitting element, and further to generate a second voltage that is derived according to a result of comparing a detection result from the first detecting section at the non-light-emission time of the light-emitting element and a detection result from the second detecting section at the non-light-emission time of the light-emitting element as a control voltage at the non-light-emission time of the light-emitting element, the first voltage being derived according to a result of comparing a detection result from the first detecting section at the light-emission time of the light-emitting element and a detection result from the second detecting section at the light-emission time of the light-emitting element, the correction voltage being derived by a predetermined calculation; and a second generating circuit configured to generate a third reference current that is equivalent to a difference between the first reference current and the second reference current by using the control voltage at the light-emission time of the light-emitting element, the first voltage, the second voltage, and the second reference current, wherein the second detecting circuit has a first adder circuit that generates the first reference current by adding the second reference current and the third reference current with each other.

(7) A driving device, including:

a driving circuit configured to provide a drive current depending on a magnitude of a control voltage to a light-emitting element;

a first detecting circuit configured to detect the drive current or a physical quantity corresponding thereto;

a second detecting circuit configured to detect a reference current to be used as a reference for the drive current or a physical quantity corresponding thereto;

a first generating circuit configured to generate a voltage obtained by adding a first voltage and a correction voltage with each other as the control voltage, the first voltage being derived according to a result of comparing a detection result from the first detecting section and a detection result from the second detecting section, the correction voltage being derived by a predetermined calculation; and a second generating circuit configured to generate the reference current by using the control voltage and the first voltage.

(8) The driving device according to (7), wherein the second generating circuit includes:
a first current source configured to generate a first current with a magnitude corresponding to a current at the time when the first voltage is applied to the light-emitting element;
a second current source configured to generate a second current equivalent to a difference between the reference current and the first current; and
an adder circuit adding the first current and the second current with each other.
(9) The driving device according to (7) or (8), wherein the first generating circuit generates the correction voltage using values of the first voltage and the first current.
(10) The driving device according to any one of (7) to (9), wherein the first generating circuit derives a light-emission resistance of the light-emitting element using values of the first voltage and the first current, and generates the correction voltage using a correction resistance that is obtained by correcting the light-emission resistance by the use of an optional resistor.
(11) The driving device according to (10), wherein the first generating circuit generates the correction voltage by multiplying the correction resistance and a current varying depending on RC time constant values and temperature information with each other.
(12) A light-emitting unit, including:
a light-emitting element;
a driving circuit configured to provide a drive current depending on a magnitude of a control voltage to the light-emitting element;
a first detecting circuit configured to detect the drive current or a physical quantity corresponding thereto;
a second detecting circuit configured to detect a reference current to be used as a reference for the drive current or a physical quantity corresponding thereto;
a first generating circuit configured to generate a voltage obtained by adding a first voltage and a correction voltage with each other as the control voltage, the first voltage being derived according to a result of comparing a detection result from the first detecting section and a detection result from the second detecting section, the correction voltage being derived by a predetermined calculation; and
a second generating circuit generating the reference current by using the control voltage and the first voltage.

It should be understood by those skilled in the art that various modifications, combinations, sub-combinations and alterations may occur depending on design requirements and other factors insofar as they are within the scope of the appended claims or the equivalents thereof.

What is claimed is:

1. A driving device, comprising:
a driving circuit configured to provide a drive current depending on a magnitude of a control voltage to a light-emitting element;
a first detecting circuit configured to detect the drive current or a physical quantity corresponding thereto;
a second detecting circuit configured to detect a first reference current to be used as a reference for a drive current at a light-emission time of the light-emitting element or a physical quantity corresponding thereto, as well as a second reference current to be used as a reference for a drive current at a non-light-emission time of the light-emitting element or a physical quantity corresponding thereto;
a first generating circuit configured to generate an additive voltage obtained by adding a first voltage and a correction voltage with each other as a control voltage at the light-emission time of the light-emitting element, and further to generate a second voltage that is derived according to a result of comparing a detection result from the first detecting circuit at the non-light-emission time of the light-emitting element and a detection result from the second detecting circuit at the non-light-emission time of the light-emitting element as a control voltage at the non-light-emission time of the light-emitting element, the first voltage being derived according to a result of comparing a detection result from the first detecting circuit at the light-emission time of the light-emitting element and a detection result from the second detecting circuit at the light-emission time of the light-emitting element, the correction voltage being derived by a predetermined calculation; and
a second generating circuit configured to generate a third reference current that is equivalent to a difference between the first reference current and the second reference current by using the control voltage at the light-emission time of the light-emitting element, the first voltage, the second voltage, and the second reference current,
wherein the second detecting circuit has a first adder circuit that generates the first reference current by adding the second reference current and the third reference current with each other.

2. The driving device according to claim 1, wherein the second generating circuit includes:
a first current source configured to generate a first current with a magnitude corresponding to a current at the time when a voltage equivalent to a difference between the first voltage and the second voltage is applied to the light-emitting element;
a second current source configured to generate a second current equivalent to a difference between the third reference current and the first current; and
a second adder circuit adding the first voltage and the second voltage with each other.

3. The driving device according to claim 2, wherein the first generating circuit generates the correction voltage using values of the first voltage, the second voltage, and the first current.

4. The driving device according to claim 3, wherein the first generating circuit derives a light-emission resistance of the light-emitting element using values of the first voltage, the second voltage, and the first current, and generates the correction voltage using a correction resistance that is obtained by correcting the light-emission resistance by the use of an optional resistor.

5. The driving device according to claim 4, wherein the first generating circuit generates the correction voltage by multiplying the correction resistance and a current varying depending on RC time constant values and temperature information with each other.

6. A light-emitting unit, comprising:
a light-emitting element;
a driving circuit configured to provide a drive current depending on a magnitude of a control voltage to the light-emitting element;
a first detecting circuit configured to detect the drive current or a physical quantity corresponding thereto;
a second detecting circuit configured to detect a first reference current to be used as a reference for a drive current at a light-emission time of the light-emitting element or a physical quantity corresponding thereto, as well as a second reference current to be used as a reference for a drive current at a non-light-emission time of the light-emitting element or a physical quantity corresponding thereto;

a first generating circuit configured to generate an additive voltage obtained by adding a first voltage and a correction voltage with each other as a control voltage at the light-emission time of the light-emitting element, and further to generate a second voltage that is derived according to a result of comparing a detection result from the first detecting circuit at the non-light-emission time of the light-emitting element and a detection result from the second detecting circuit at the non-light-emission time of the light-emitting element as a control voltage at the non-light-emission time of the light-emitting element, the first voltage being derived according to a result of comparing a detection result from the first detecting circuit at the light-emission time of the light-emitting element and a detection result from the second detecting circuit at the light-emission time of the light-emitting element, the correction voltage being derived by a predetermined calculation; and a second generating circuit configured to generate a third reference current that is equivalent to a difference between the first reference current and the second reference current by using the control voltage at the light-emission time of the light-emitting element, the first voltage, the second voltage, and the second reference current, wherein the second detecting circuit has a first adder circuit that generates the first reference current by adding the second reference current and the third reference current with each other.

7. A driving device, comprising:
a driving circuit configured to provide a drive current depending on a magnitude of a control voltage to a light-emitting element;
a first detecting circuit configured to detect the drive current or a physical quantity corresponding thereto;
a second detecting circuit configured to detect a reference current to be used as a reference for the drive current or the physical quantity corresponding thereto;
a first generating circuit configured to:
  generate a voltage obtained by adding a first voltage and a correction voltage with each other as the control voltage, the first voltage being derived according to a result of comparing a detection result from the first detecting circuit and a detection result from the second detecting circuit;
  derive a light-emission resistance of the light-emitting element using values of the first voltage and a first current associated with the first voltage; and
  generate the correction voltage by multiplying a correction resistance with a current that varies depending on RC time constant values and temperature information, wherein the correction resistance is obtained by correcting the light-emission resistance; and
a second generating circuit configured to generate the reference current by using the control voltage and the first voltage.

8. The driving device according to claim 7, wherein the second generating circuit comprises:
a first current source configured to generate the first current with a magnitude corresponding to a current at the time when the first voltage is applied to the light-emitting element;
a second current source configured to generate a second current equivalent to a difference between the reference current and the first current; and
an adder circuit adding the first current to the second current.

9. The driving device according to claim 8, wherein the first generating circuit generates the correction voltage using values of the first voltage and the first current.

10. The driving device according to claim 9, wherein the first generating circuit generates the correction voltage using the correction resistance obtained by correcting the light-emission resistance using an optional resistor.

11. A light-emitting unit, comprising:
a light-emitting element;
a driving circuit configured to provide a drive current depending on a magnitude of a control voltage to the light-emitting element;
a first detecting circuit configured to detect the drive current or a physical quantity corresponding thereto;
a second detecting circuit configured to detect a reference current to be used as a reference for the drive current or the physical quantity corresponding thereto;
a first generating circuit configured to:
  generate a voltage obtained by adding a first voltage and a correction voltage with each other as the control voltage, the first voltage being derived according to a result of comparing a detection result from the first detecting circuit and a detection result from the second detecting circuit;
  derive a light-emission resistance of the light-emitting element using values of the first voltage and a first current associated with the first voltage; and
  generate the correction voltage by multiplying a correction resistance with a current that varies depending on RC time constant values and temperature information, wherein the correction resistance is obtained by correcting the light-emission resistance; and
a second generating circuit configured to generate the reference current by using the control voltage and the first voltage.

* * * * *